(12) United States Patent
Ashtekar et al.

(10) Patent No.: US 10,613,133 B2
(45) Date of Patent: Apr. 7, 2020

(54) ELECTRICAL GROUND AND TEST DEVICES AND RELATED METHODS

(71) Applicant: Eaton Intelligent Power Limited, Dublin (IE)

(72) Inventors: Koustubh Dnyandeo Ashtekar, Moon Township, PA (US); Brad Robert Leccia, Bethel Park, PA (US); Daniel Evan Palmieri, Coraopolis, PA (US)

(73) Assignee: Eaton Intelligent Power Limited, Dublin (IE)

( * ) Notice: Subject to any disclaimer, the term of this patent is extended or adjusted under 35 U.S.C. 154(b) by 80 days.

(21) Appl. No.: 15/975,009

(22) Filed: May 9, 2018

(65) Prior Publication Data

US 2019/0072602 A1 Mar. 7, 2019

Related U.S. Application Data

(60) Provisional application No. 62/554,701, filed on Sep. 6, 2017.

(51) Int. Cl.
| | | |
|---|---|---|
| *G01R 31/25* | (2006.01) | |
| *G01R 31/02* | (2006.01) | |
| *G01R 31/327* | (2006.01) | |
| *H02B 13/075* | (2006.01) | |
| *H02B 11/28* | (2006.01) | |

(52) U.S. Cl.
CPC ....... *G01R 31/025* (2013.01); *G01R 31/3272* (2013.01); *H02B 11/28* (2013.01); *H02B 13/075* (2013.01)

(58) Field of Classification Search
CPC .......... G01R 31/025; G01R 31/3272; H02B 13/075; H02B 11/28
See application file for complete search history.

(56) References Cited

U.S. PATENT DOCUMENTS

| | | | | |
|---|---|---|---|---|
| 3,130,352 A | * | 4/1964 | Guinan ................. | H02B 11/28 361/606 |
| 4,202,028 A | * | 5/1980 | Baird ..................... | H02B 11/10 200/50.26 |
| 8,482,903 B2 | * | 7/2013 | Milovac ................. | H02B 11/00 361/605 |
| 2011/0163837 A1 | * | 7/2011 | Darr ........................ | H01H 1/20 337/186 |
| 2015/0262767 A1 | * | 9/2015 | Benke .................... | H01H 71/12 200/50.27 |
| 2016/0036205 A1 | * | 2/2016 | Ricciuti ................ | H02B 13/02 200/293 |
| 2016/0241003 A1 | * | 8/2016 | Frye ....................... | H02B 13/00 |

* cited by examiner

*Primary Examiner* — Dominic E Hawkins
(74) *Attorney, Agent, or Firm* — Myers Bigel, P.A.

(57) ABSTRACT

Ground and test devices (G&TD) have an interchangeable test configuration using serially releasably mountable first and second ground assemblies and releasably mounted primary arm conductors thereby allowing for onsite field modification of a base test unit for use to test either the load side or line side terminals without requiring two separate base test devices providing an economic and less bulky test solution for end users.

25 Claims, 16 Drawing Sheets

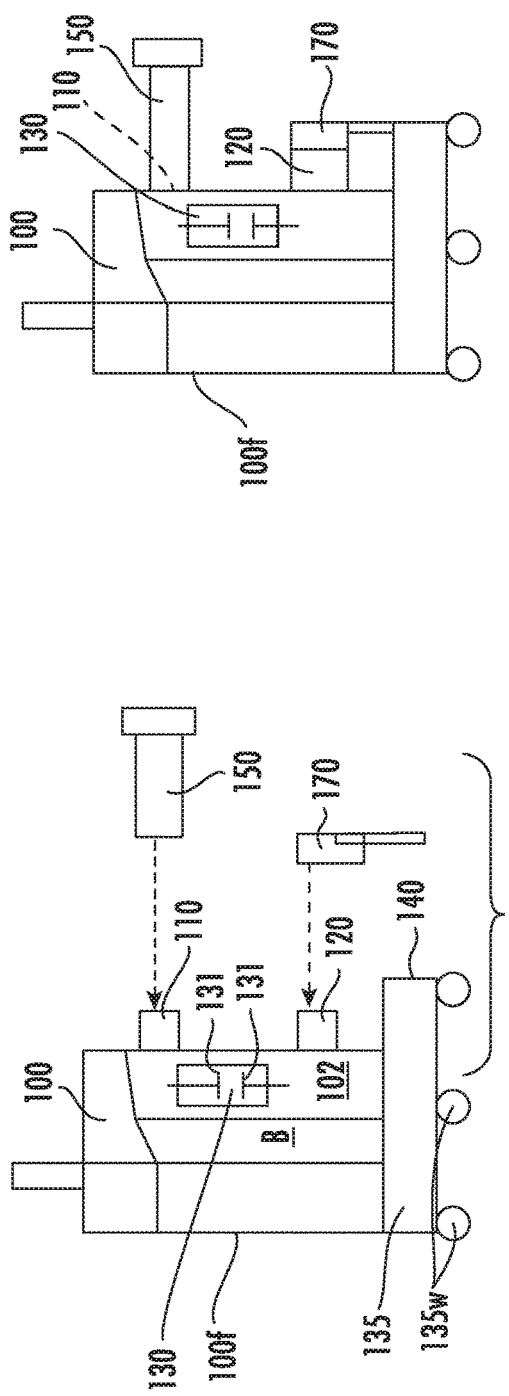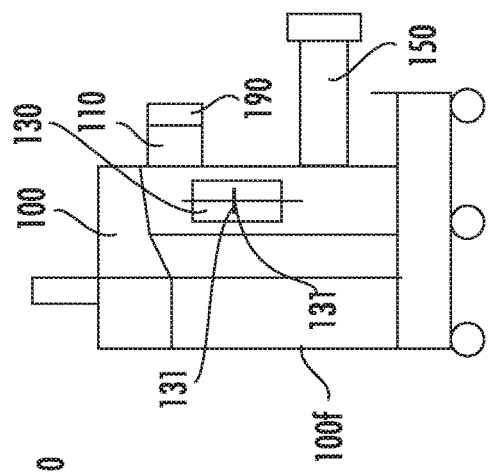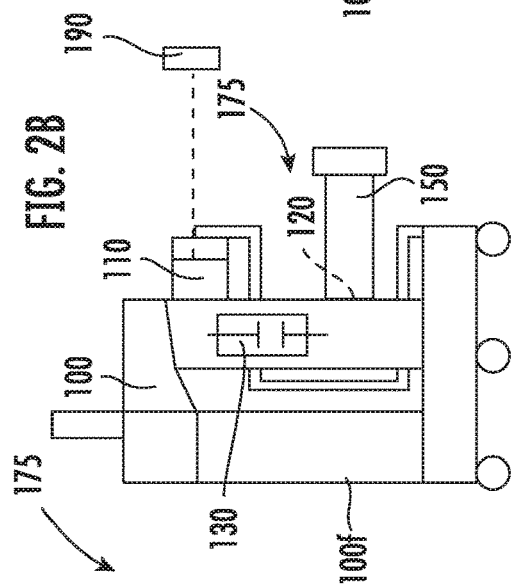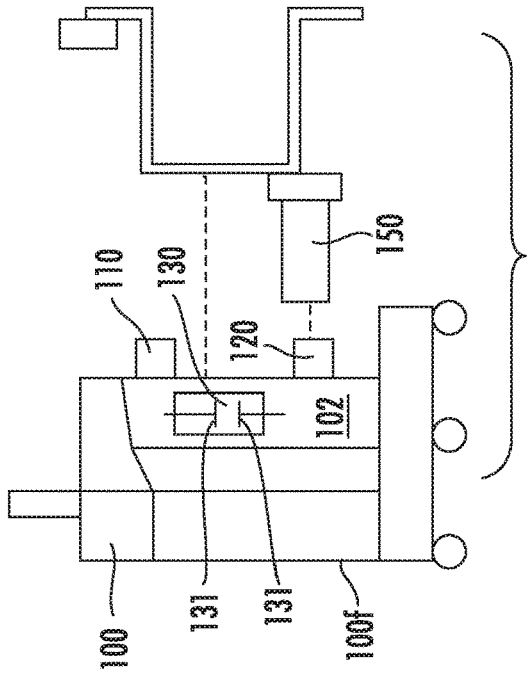

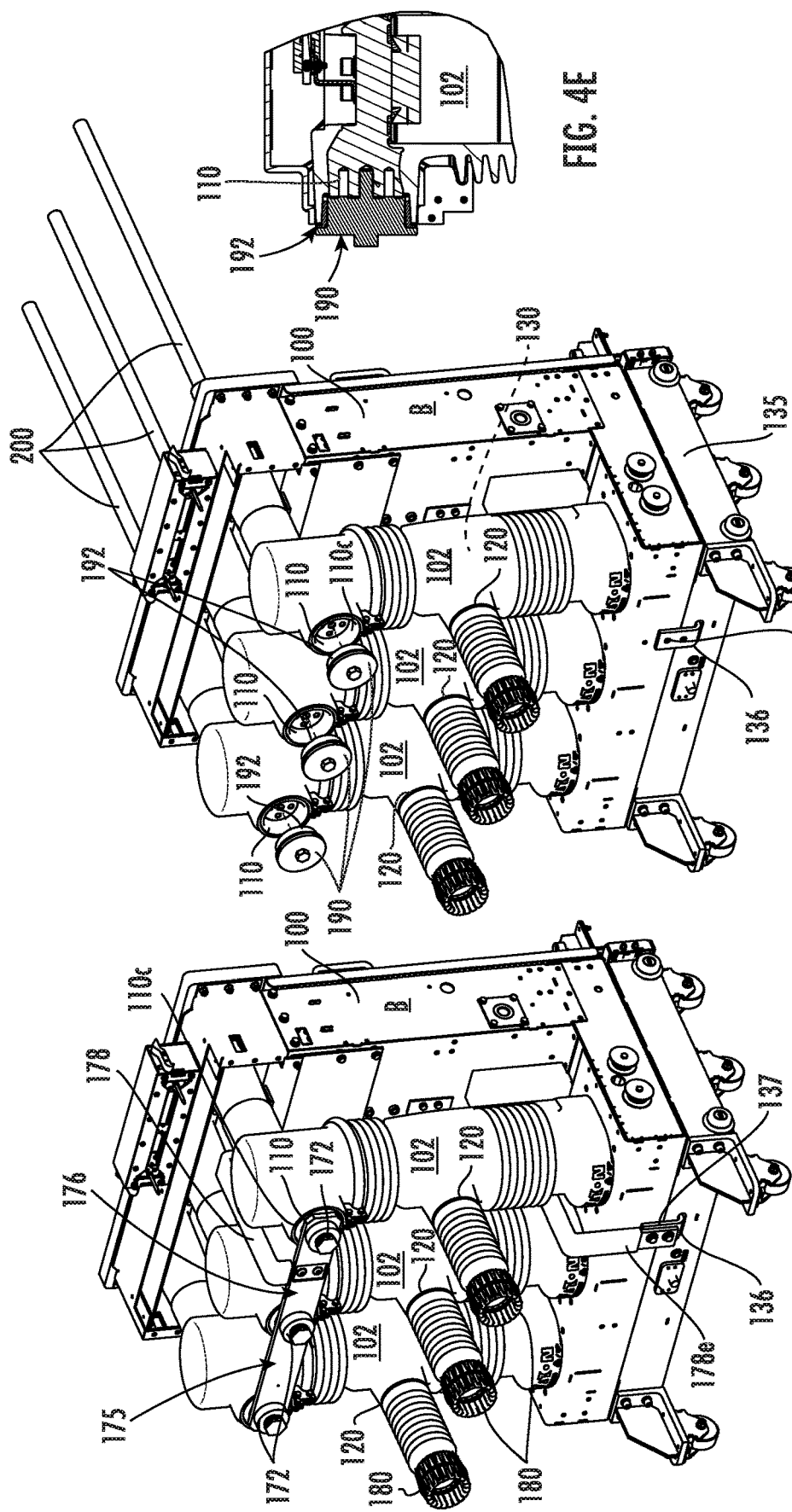

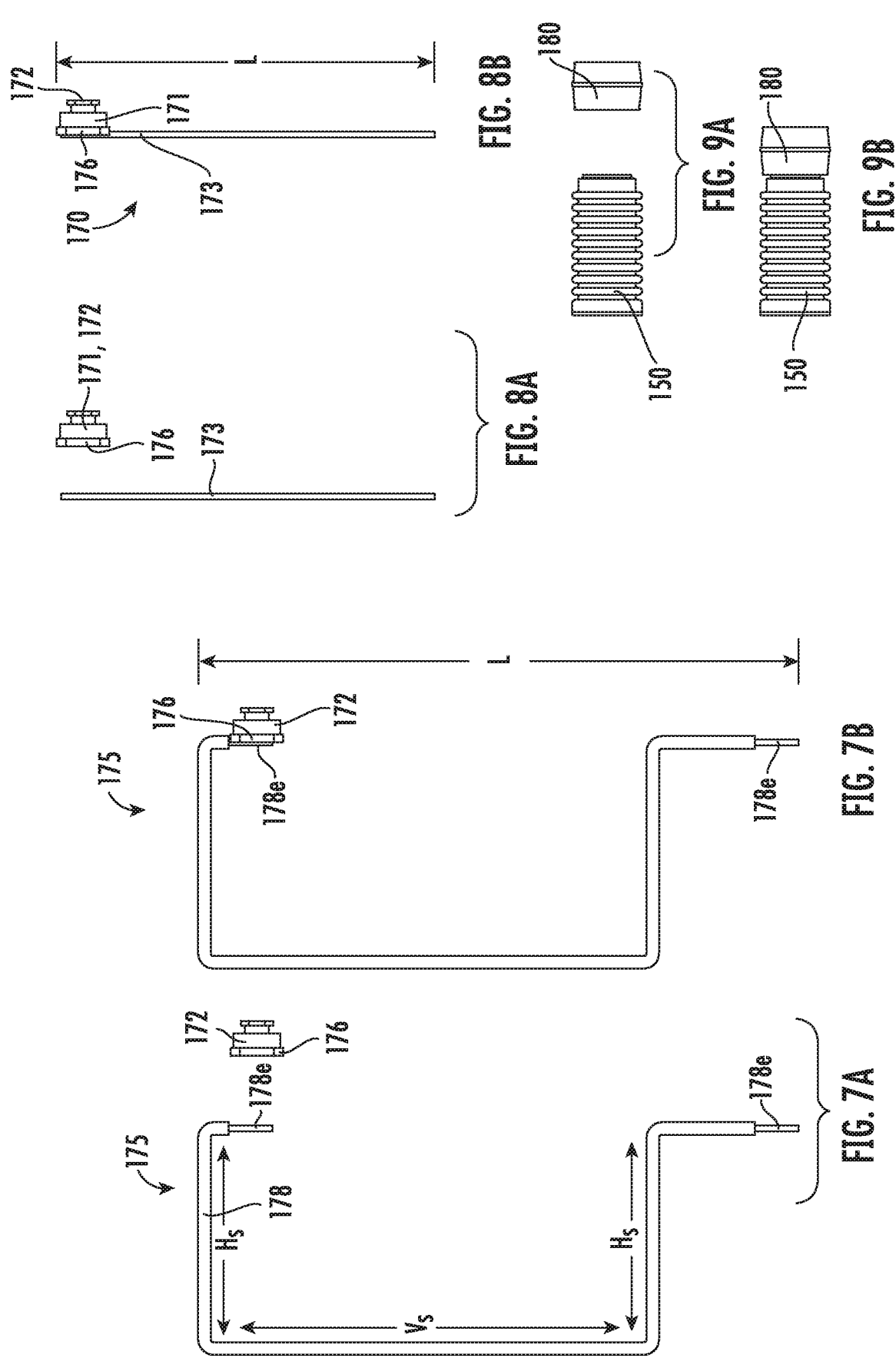

ELECTRICAL GROUND AND TEST DEVICES AND RELATED METHODS

RELATED APPLICATIONS

This application claims the benefit of and priority to U.S. Provisional Application Ser. No. 62/554,701 filed Sep. 6, 2017, the contents of which are hereby incorporated by reference as if recited in full herein.

FIELD OF THE INVENTION

The present invention relates to electrical ground and test devices for switchgears or other electrical distribution devices.

BACKGROUND OF THE INVENTION

Conventionally, two separate test devices, sometimes referred to as "Simple Electrically Operated Ground & Test Devices (SEOG&TDs)" are used for grounding the load or line sides of a switchgear or cell. Typically, the load side (i.e., lower terminals) is grounded by an SEOG&TD lower version while a line side (i.e., upper terminals) is grounded by an SEOG&TD upper version. Due to the complex assembly and dielectric performance requirements, the upper and lower SEOG&TDs 10U, 10L, respectively, were completely separate and dedicated devices as shown in FIG. 1A. Thus, depending on the end customer's requirements, a user needed both relatively large and dedicated test devices even though those devices may have limited use. FIG. 1B illustrates another known prior art device with a relatively expensive and bulky complex EOG&TD 10C that provides an integrated upper and lower test device with internal switches and two affixed sets of outwardly projecting primary conductor arms as integrated/onboard conductor assemblies.

SUMMARY OF EMBODIMENTS OF THE INVENTION

Embodiments of the present invention provide a modular test body that can releasably and serially engage upper and lower ground assemblies allowing for a less bulky and more economic multi-purpose ground and test (G&TD) device.

Embodiments of the present invention are directed to a ground and test device (G&TD) that includes: a test device housing comprising a switch; a plurality of upper terminals coupled to the switch; a plurality of lower terminals coupled to the switch; a ground connection interface coupled to the test device housing; a first ground assembly releasably attached to or attachable to the test device housing, the first ground assembly comprising a plurality of insulating caps, one each coupled to a corresponding one terminal of the upper or lower terminals and electrically coupled to the ground connection interface; and a plurality of primary conductor arms releasably attached to only the upper terminals or only the lower terminals when the first ground assembly is in position on the test device housing.

The first ground assembly can include a first member that holds the insulating caps and a second member that is attached to the first member. The second member can have an end portion that is attached to the ground connection interface.

The test device housing can have a base with a back wall having an aperture and the ground connection interface can include a metal bar that extends out of the aperture.

The G&TD can also include a second ground assembly releasably attachable to the test device housing. The second ground assembly can include a second member that has a length that is greater than the second member of the first ground assembly.

The second member of the second ground assembly can serially releasably attach to the first member of the first ground assembly in place of the second member of the first ground assembly.

The second member of the second ground assembly can have a medial vertical segment that merges into upper and lower horizontal segments that place outer end portions of the horizontal segments further away from a front of the test device housing than the vertical segment.

The first ground assembly can have a first member that is held horizontally oriented on the test device housing. The first member can be releasably attachable to a second member at a location between neighboring insulating caps and the second member can have an end portion that is releasably attached to the ground connection interface.

The first ground assembly can have a first ground bar that holds the plurality of spaced apart insulating caps and a first bus member that is releasably attachable to the ground bar. The G&TD can also include a second bus member that is releasably interchangeably attachable to the first ground bar in lieu of the first bus member. The first and second bus members can have different vertical lengths. Each of the first and second bus members can have opposing upper and lower end portions with at least one aperture that releasably engages a fixation member. The upper end portion of each of the first and second bus members can releasably serially couple to the first ground bar. The lower end portion of each of the first and second bus members can releasably and serially couple to the ground connection interface. In position on the test device housing in a first G&TD assembled configuration, the first ground assembly can place the ground bar across the lower terminals and in position on the test device housing in a second G&TD assembled configuration, the second bus bar can place the ground bar across the upper terminals.

The first ground assembly can include a first bus bar releasably coupled to a first ground bar. The first ground bar can include at least one aperture between a neighboring pair of the insulating caps. The first bus bar can include at least one aperture at an upper end portion thereof and at least one aperture at a lower end portion thereof. The first ground assembly can also include fixation members that are configured to couple the first bus bar to the first ground bar and couple the first bus bar to the ground connection interface.

The first ground assembly can have a planar ground bar with a width greater than a height thereof and comprising a conductive primary substrate with an outer layer or coating of a non-conductive material that holds the insulating caps. There can be three of the insulating caps and the planar bus bar can be releasably attachable to the ground bar in an orientation that is orthogonal to the bus bar. The bus bar can include upper and lower end portions, each of the upper and lower end portions comprising at least one aperture. The ground connection interface can include at least one through aperture and the first ground assembly can also include fixation members that extend through the at least one aperture of the upper and lower end portions of the bus bar with the at least one aperture of the lower end portion configured to align with the at least one aperture of the ground connection interface to releasably attach to the ground connection interface. The upper end portion of the bus bar can be configured to align the at least one aperture with the at least one aperture of the ground bar to releasably attach the ground bar to the bus bar with the fixation members extending through aligned at least one aperture.

Other embodiments are directed toward kits of components for a ground and test device (G&TD). The kits include a ground bar comprising a plurality of spaced apart insulating caps sized and configured to serially and interchangeably couple to either only upper terminals of the G&TD or only lower terminals of the G&TD and a bus bar that releasably attaches to or is attached to the ground bar.

The ground bar can include at least one aperture between a neighboring pair of the insulating caps. The kit can also include at least one fixation member that is configured to couple the bus bar to the ground bar and extends through the at least one aperture.

The bus bar can be releasably attached to the ground bar (optionally releasably attachable to the ground bar in an orientation that is orthogonal to the bus bar). The bus bar can have upper and lower end portions, each of the upper and lower end portions can include at least one aperture. The kit can include fixation members that extend through the at least one aperture of the upper and lower end portions. The lower end portion can be configured to releasably attach to a ground connection interface of the G&TD and the upper end portion can be configured to releasably attach to the ground bar.

The plurality of spaced apart insulating caps is three. The bus bar can be a first bus bar and the kit can also include a second bus bar that can have a length that is greater or smaller than the first bus bar. The first and second bus bars can serially and interchangeably releasably attach to the ground bar.

The kit can also include three primary conductor bars that releasably attach to either only the upper terminals or only the lower terminals at any one time.

Still other embodiments are directed to methods for modifying a ground and test device (G&TD), for testing a switchgear. The methods include: providing a test device with upper and lower terminals and a first ground connection interface, wherein the test device is configured to releasably engage primary conductor arms and first and second ground assemblies; configuring the test device to include only the first ground assembly coupled to the ground connection interface with the primary conductor arms on only the upper or only the lower terminals for a first test configuration; then configuring the test device to include only the second ground assembly coupled to the ground connection interface with the primary conductor arms on only the other of the upper terminals or the lower terminals for a second test configuration.

The configuring steps can include removing three primary conductor arms from either the upper or lower terminals and placing the same three primary conductor arms on the other of the upper or lower terminals.

The first and second ground assemblies can include first and second bus members of different shapes and/or different vertical lengths. The configuring steps can include removing the first bus member attached to a horizontally oriented ground member and attaching the second bus member to the horizontally oriented ground member, then attaching the horizontally oriented ground member comprising insulating caps to either the lower terminals or the upper terminals and attaching the second bus member to the ground connection interface of the test device.

The first ground connection interface can reside on a back side of a base of the test device and can be configured to releasably and serially engage lower ends of first and second bus members of the first and second ground assemblies.

The second ground assembly can be attached by inserting a second bus member behind poles providing three phases of the test device from a top side thereof and sliding the second bus member downward to align with the first ground connection interface and position a horizontal ground member over the upper terminals, optionally the second bus member has a "C" shape with a medial vertical length separating first and second rearwardly projecting horizontal segments.

Yet other embodiments are directed to methods of operating a ground and test device (G&TD). The methods include: providing a G&TD with internal switches having switch contacts associated with poles of the G&TD and a plurality of upper and lower terminals, with primary conductors attached to only the upper terminals or only the lower terminals at any one operational test configuration; and selectively grounding the G&TD in a first test configuration by closing the switch contacts or grounding the G&TD in a second test configuration by opening the switch contacts.

The method may include voltage sensing using either the first test configuration or the second test configuration.

The method can include inserting voltage probes into or removing voltage probes from G&TD probing sockets when the G&TD is in the first test configuration and at a Test position of a switchgear or cell thereby providing a safety feature.

The method can include inserting voltage probes into or removing voltage probes from G&TD probing sockets when the G&TD is the second test configuration and at TEST position of the switchgear or cell thereby providing a safety feature.

Further features, advantages and details of the present invention will be appreciated by those of ordinary skill in the art from a reading of the figures and the detailed description of the preferred embodiments that follow, such description being merely illustrative of the present invention.

It is noted that aspects of the invention described with respect to one embodiment, may be incorporated in a different embodiment although not specifically described relative thereto. That is, all embodiments and/or features of any embodiment can be combined in any way and/or combination. Applicant reserves the right to change any originally filed claim or file any new claim accordingly, including the right to be able to amend any originally filed claim to depend from and/or incorporate any feature of any other claim although not originally claimed in that manner. These and other objects and/or aspects of the present invention are explained in detail in the specification set forth below.

BRIEF DESCRIPTION OF THE DRAWINGS

FIG. 2A is a side schematic view of a test device with a releasably attachable first ground assembly and primary conductor components according to embodiments of the present invention.

FIG. 2B is an assembly view of the device and components shown in FIG. 2A.

FIG. 3A is a side schematic view of a test device with a releasably attachable second ground assembly and primary conductor components according to embodiments of the present invention.

FIG. 3B is an assembly view of the device and components shown in FIG. 3A.

FIG. 3C is a side schematic view of a different assembled view with the ground assembly shown in FIG. 3A and FIG. 3B removed for voltage sensing according to embodiments of the present invention.

FIG. 4C is a rear side perspective view of one assembly configuration of the test device shown in FIG. 4A according to embodiments of the present invention.

FIG. 4D is a rear side perspective partial exploded and assembly view of one alternate assembly configuration of the test device shown in FIG. 4A according to embodiments of the present invention.

FIG. 4E is an enlarged partial section assembled view of the insulating plug and upper terminal connections shown in FIG. 4D according to embodiments of the present invention.

FIG. 7A is a side view of a vertical bus bar and plug and shunt sub-assembly for a ground assembly that can be assembled together according to embodiments of the present invention.

FIG. 7B is a side assembled view of the devices shown in FIG. 7A which can be pre-assembled (for an easy "plug and play configuration") or assembled onsite according to embodiments of the present invention.

FIG. 8A is a side view of a vertical bus bar and plug and shunt sub-assembly that can be assembled together according to embodiments of the present invention.

FIG. 8B is a side assembled view of the devices shown in FIG. 8A which can be pre-assembled (for an easy "plug and play configuration") or assembled onsite according to embodiments of the present invention.

FIG. 9A is a side view of a primary conductor arm primary disc that can be assembled together according to embodiments of the present invention.

FIG. 9B is a side assembled view of the devices shown in FIG. 9A which can be pre-assembled (for an easy "plug and play configuration") or assembled onsite according to embodiments of the present invention.

DETAILED DESCRIPTION OF EMBODIMENTS OF THE INVENTION

Figure 1A:
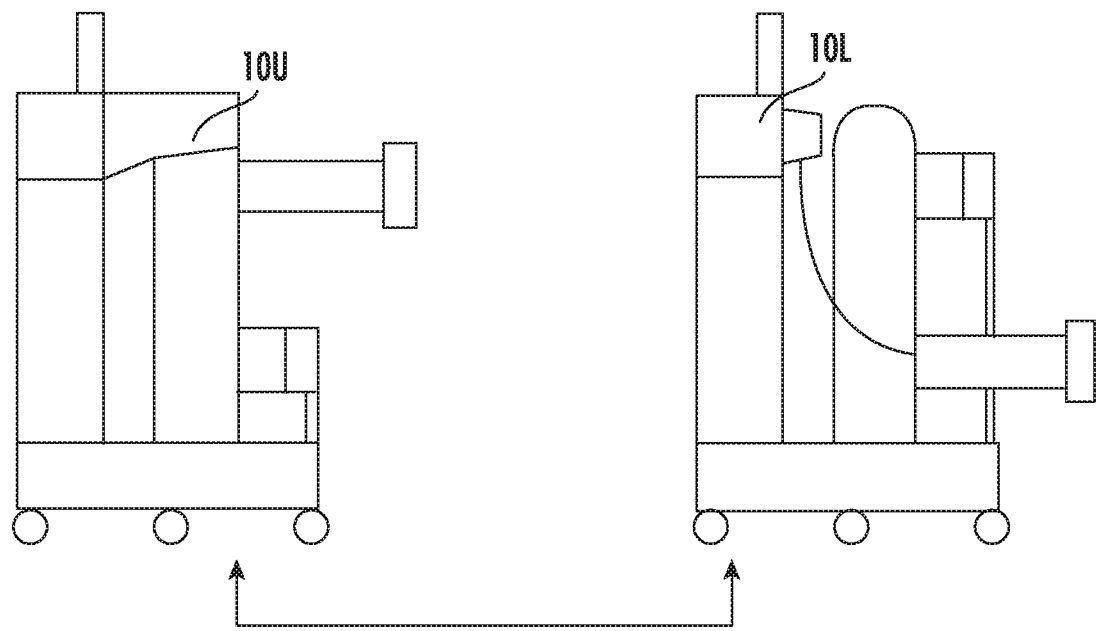
FIG. 1A is a side schematic illustration of a prior art upper and lower version of simple electrically operated ground and test devices (SEG&TD).
Figure 1B:
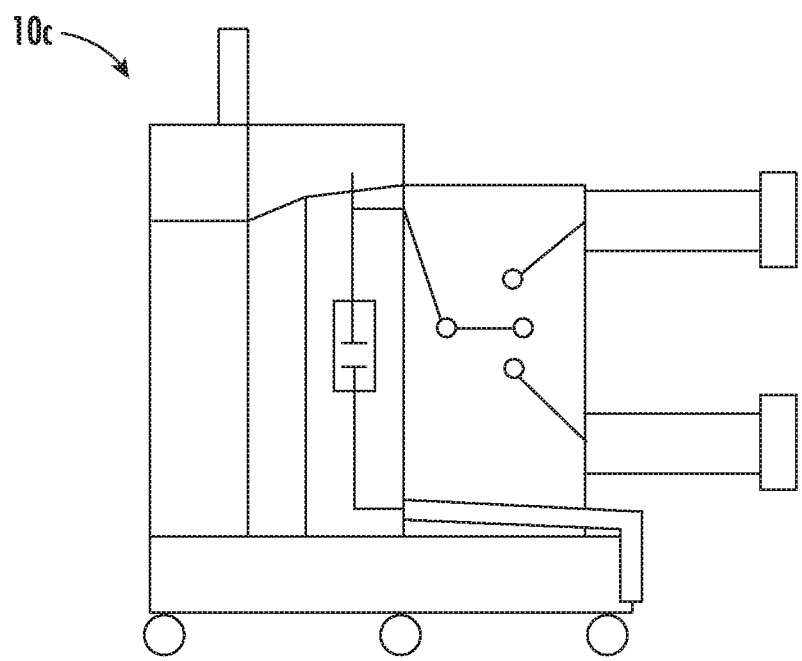
FIG. 1B is a side schematic illustration of another prior art G&TD.

The present invention now will be described more fully hereinafter with reference to the accompanying drawings, in which illustrative embodiments of the invention are shown. Like numbers refer to like elements and different embodiments of like elements can be designated using a different number of superscript indicator apostrophes (e.g., 10, 10', 10").

In the drawings, the relative sizes of regions or features may be exaggerated for clarity. This invention may, however, be embodied in many different forms and should not be construed as limited to the embodiments set forth herein; rather, these embodiments are provided so that this disclosure will be thorough and complete, and will fully convey the scope of the invention to those skilled in the art. The term "Fig." (whether in all capital letters or not) is used interchangeably with the word "Figure" as an abbreviation thereof in the specification and drawings.

In addition, the sequence of operations (or steps) is not limited to the order presented in the claims unless specifically indicated otherwise.

It will be understood that, although the terms first, second, etc. may be used herein to describe various elements, components, regions, layers and/or sections, these elements, components, regions, layers and/or sections should not be limited by these terms. These terms are only used to distinguish one element, component, region, layer or section from another region, layer or section. Thus, a first element, component, region, layer or section discussed below could be termed a second element, component, region, layer or section without departing from the teachings of the present invention. Broken lines in the flow charts represent optional features or steps.

Spatially relative terms, such as "beneath", "below", "lower", "above", "upper" and the like, may be used herein for ease of description to describe one element or feature's relationship to another element(s) or feature(s) as illustrated in the figures. It will be understood that the spatially relative terms are intended to encompass different orientations of the device in use or operation in addition to the orientation depicted in the figures. For example, if the device in the figures is turned over, elements described as "below" or "beneath" other elements or features would then be oriented "above" the other elements or features. Thus, the exemplary term "below" can encompass both an orientation of above and below. The device may be otherwise oriented (rotated 90° or at other orientations) and the spatially relative descriptors used herein interpreted accordingly.

The term "about" refers to numbers in a range of +/−20% of the noted value.

As used herein, the singular forms "a", "an" and "the" are intended to include the plural forms as well, unless expressly stated otherwise. It will be further understood that the terms "includes," "comprises," "including" and/or "comprising," when used in this specification, specify the presence of stated features, integers, steps, operations, elements, and/or components, but do not preclude the presence or addition of one or more other features, integers, steps, operations, elements, components, and/or groups thereof. It will be understood that when an element is referred to as being "connected" or "coupled" to another element, it can be directly connected or coupled to the other element or intervening elements may be present. As used herein, the term "and/or" includes any and all combinations of one or more of the associated listed items.

Unless otherwise defined, all terms (including technical and scientific terms) used herein have the same meaning as commonly understood by one of ordinary skill in the art to which this invention belongs. It will be further understood that terms, such as those defined in commonly used dictionaries, should be interpreted as having a meaning that is consistent with their meaning in the context of this specification and the relevant art and will not be interpreted in an idealized or overly formal sense unless expressly so defined herein.

Referring now to FIGS. 2A, 2B, and 3A-3C, an electrical ground and test device 100 can have a housing 100h that is configured to serially releasably engage first and second ground assemblies 170, 175, respectively. Thus, the housing 100h is a base unit that can interchangeably serially engage the two different ground assemblies to provide at least two different operative configurations for electrical testing of an electrical device such as a switchgear. FIGS. 2A and 2B illustrate the first ground assembly 170 can engage the lower terminals 120 while the only primary conductor arms 150 attached thereto in this configuration engage the upper terminals 110. FIGS. 3A and 3B illustrate the second ground assembly 175 can engage the upper terminals 110 while primary conductor arms 150 as the only primary conductor arms in this configuration engage the lower terminals 120. FIG. 3C illustrates that the second ground assembly 175 can be removed and the upper terminals 110 plugged with plug 190 and the switch 130 can be closed for voltage sensing. The primary conductor arms 150 can remain attached to the lower terminals 120. The primary conductor arms 150 can be the same three used for upper and lower terminals or may be provided as different sets of primary conductor arms with the same or different lengths. The primary conductor arms 150 can be horizontally oriented and project rearwardly away from the front of the housing 100f. The primary conductor arms 150 can have any suitable length. In some particular embodiments, the primary conductor arms 150 can have a length that is between about 10-18 inches, such as about 12 inches in some particular embodiments. The primary conductor arms 150 can have the same length or different lengths.

The test device housing 100h can include a base and/or cradle truck 135 that can have a greater back to front extent than a front 100f which can be a taller portion of the housing 100h. The test device 100 can also be referred to as a circuit breaker, typically comprising an internal switch 130 with switch contacts 131 that can be opened (FIG. 3A, for example) and closed (FIG. 3C, for example) for connected, disconnected and test states of the target electrical apparatus, i.e., switchgear. The test device 100 can provide a plurality of poles 102, typically three poles for three phases, with respective upper and lower terminals 110, 120. The upper terminals 110 can be for line side electrical connections and the lower terminals 120 may be for load side electrical connections although the terminals can alternatively be configured in the reverse.

The test device 100 can comprise a breaker mechanism "B" in communication with the switch 130. The switch 130 can comprise a vacuum interrupter (VI) or other suitable ground switch.

The test device 100 can have a housing 100h with a base 135 known as a "cradle" or "truck". The test device 100 can be configured as a Roll on the Floor ("ROF" device) associated with so-called "draw out breakers or draw out test devices." The ROF test device 100 can be configured to roll into a cell or switchgear for engaging with electrical circuit components in an operative position.

Figure 4A:
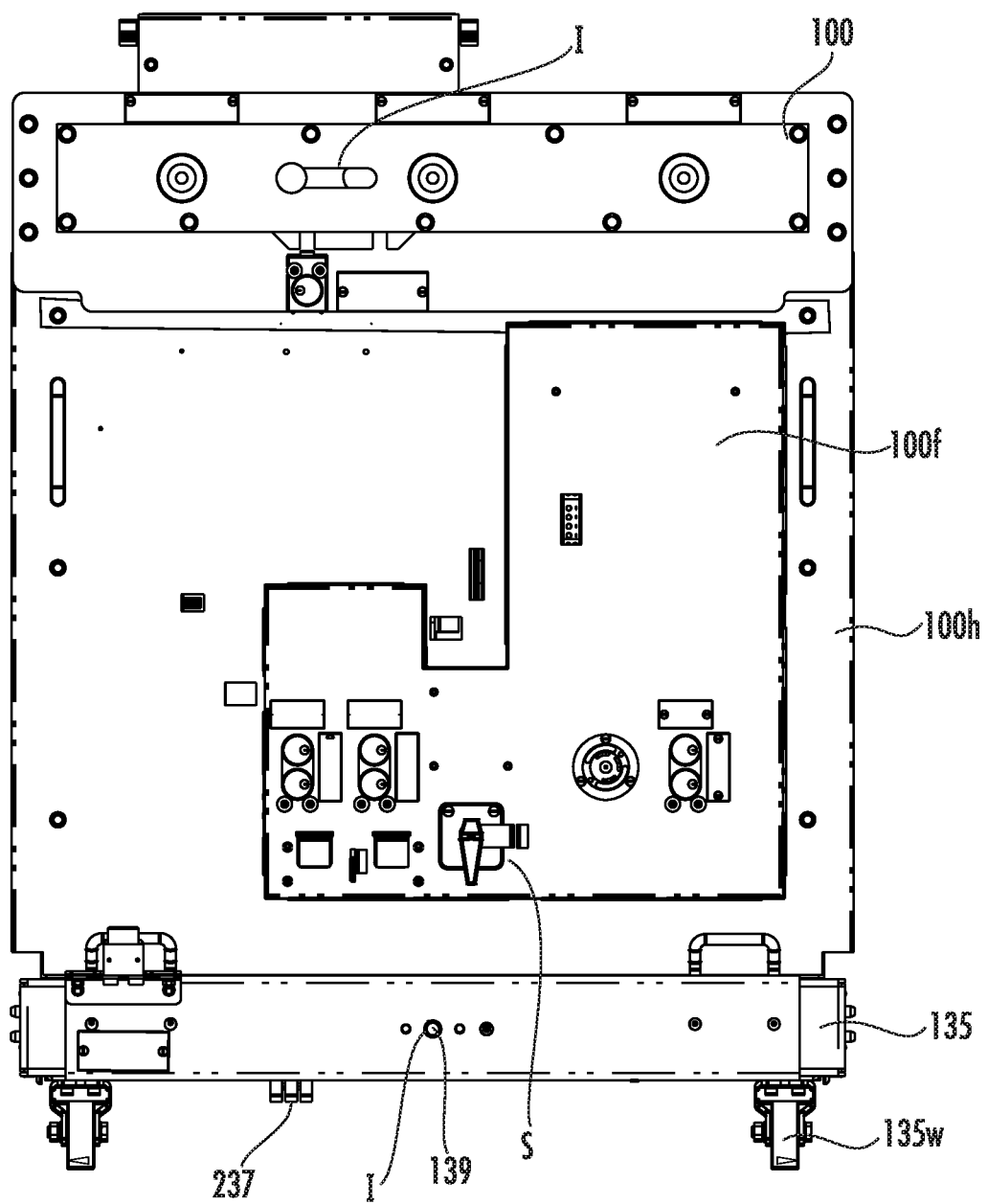
FIG. 4A is a front view of an exemplary test device according to embodiments of the present invention.
Figure 5A:
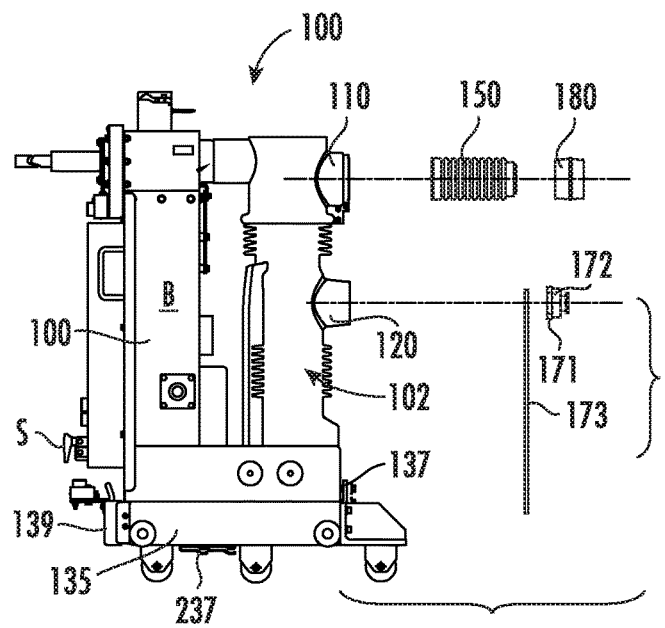
FIG. 5A is a side partial exploded view of a test device with a releasably attachable first ground assembly and primary conductor components according to embodiments of the present invention.

Referring to FIGS. 4A and 5A, for example, the test device 100 can include a rack in and rack out mechanism 139, a selector switch S (for allowing close and open operation as is known to those of skill in the art), interlocks I and KIRK locks accessible via the front side of the housing 100 and other components as is well known to those of skill in the art.

Figure 4B:
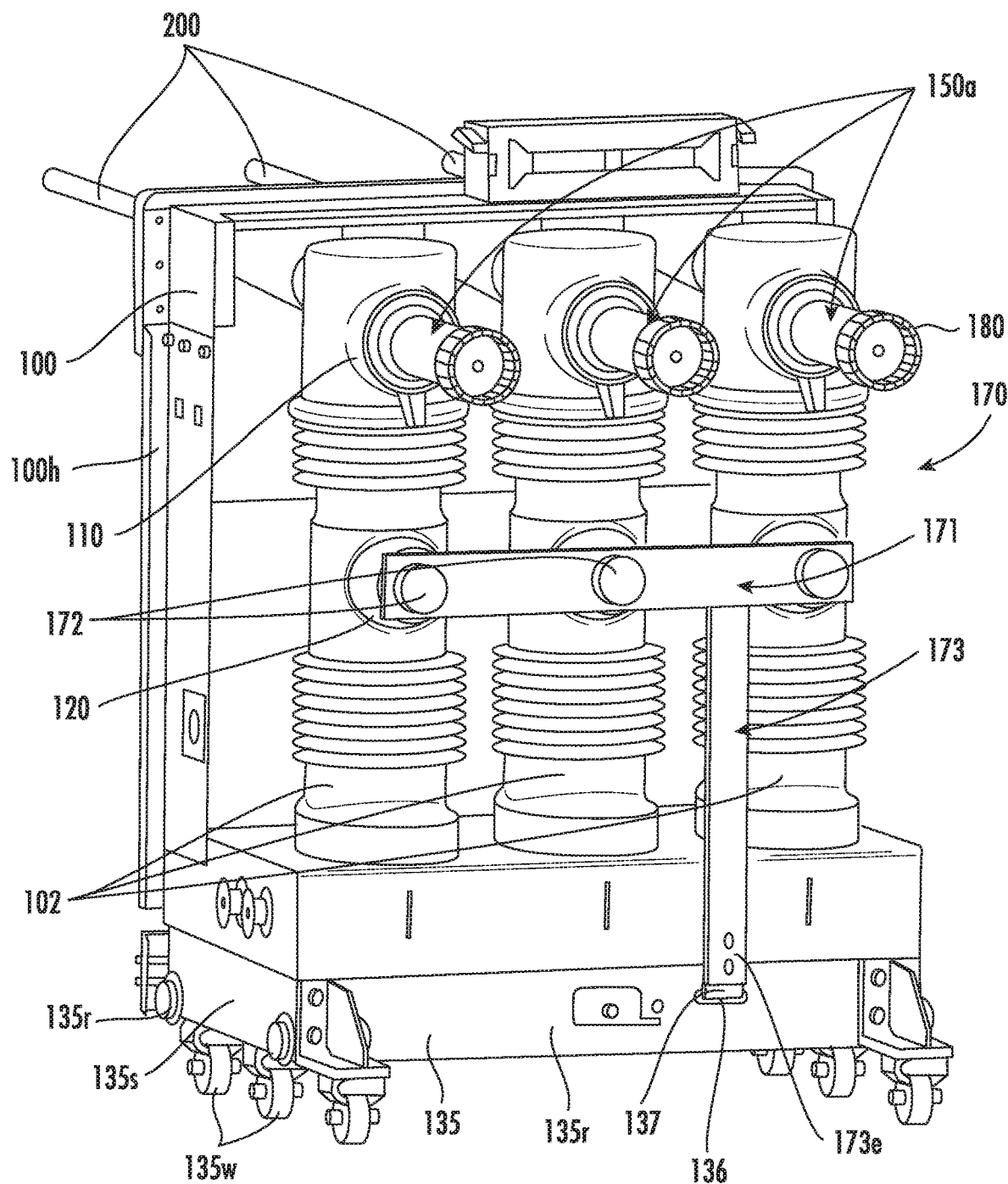
FIG. 4B is a rear perspective view of the test device shown in FIG. 4A according to embodiments of the present invention.

Referring to FIG. 4B, the base 135 can include wheels 135w that can roll on a floor. As also shown in FIG. 4B, the base 135 may also include (typically smaller) right and left side rack-in and out wheels 135r on sidewalls 135s that can engage tracks or rails in a housing of an electrical distribution device such as a switchgear as is well known to those of skill in the art.

The test device 100 can be available in various sizes typically as small, medium and large units with arc extinguishing units such as vacuum interrupters, e.g., low, medium or high voltage circuit breakers. The weight of these units can range from a few pounds to a few thousand pounds. The test devices 100 can be used to test a number of utility, commercial, industrial and residential environments including distribution stations, main stations, power plants, shops and offices, commercial buildings, industrial production facilities and the like, as is well known to those of skill in the art.

Figure 5B:
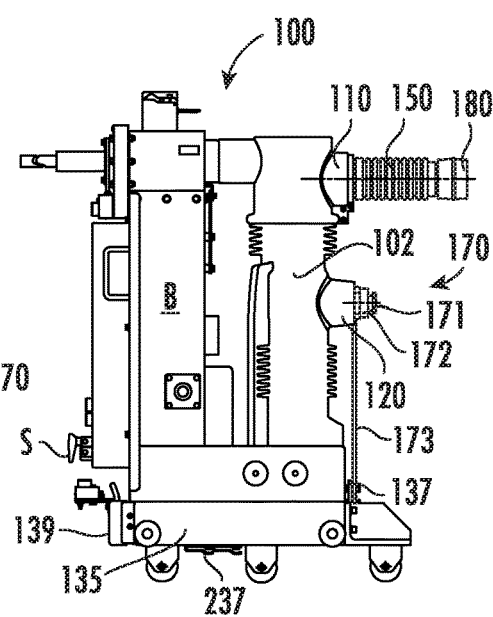
FIG. 5B is an assembly view of the device and components shown in FIG. 5A.

As shown in FIGS. 4B, 5A and 5B, the first ground assembly 170 can comprise a first member 171 which can be interchangeably referred to as a horizontal "ground or "shunt" member 171 that aligns with and is coupled to the lower terminals 120 and second member 173 that is releasably or fixedly attached to the first member 171. The second member 173 can be an upright member 173 (i.e., bus bar) that is typically releasably attached to the first member 171 (typically at an upper end portion as shown) and is also releasably attached at a longitudinally spaced apart segment to a ground connection interface 137. The test device 100 can also be configured with a plurality of primary conductor arms 150 that are attached to the upper terminals 110. The primary conductor arms 150 can have primary discs 180. The primary disc 180 is shown as a separate component from the primary conductor arm 150 but they may be configured as an integrated single component.

Figure 13A:
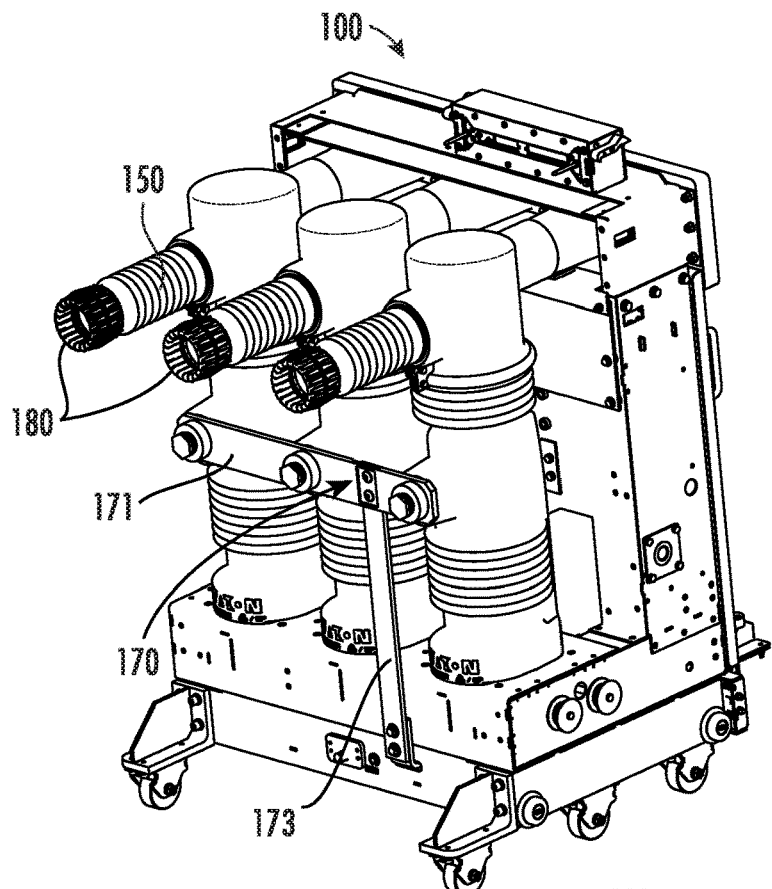
FIG. 13A is a rear side perspective view of a test device with a first ground assembly coupled to the lower terminals and primary arm conductors attached to the upper terminals according to embodiments of the present invention.
Figure 13B:
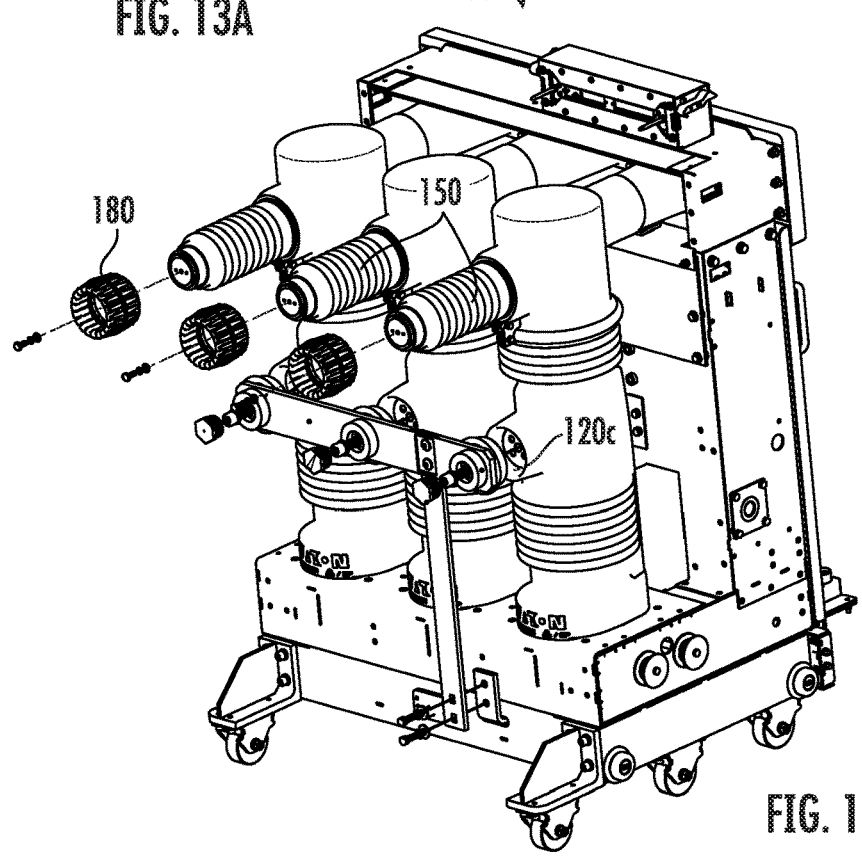
FIGS. 13B-13F are rear side perspective views of the test device shown in FIG. 13A with components being removed and replaced for converting the test device to engage a second ground assembly coupled to the upper terminals and placing the primary arm conductors on the lower terminals according to embodiments of the present invention.

As shown in FIG. 4B and FIG. 13A, the first member 171 can have a width sufficient to extend across all of the lower terminals 120 and can hold a plurality of laterally spaced apart electrically non-conductive (e.g., nylon) plugs and/or spacers 172 that can couple to a cavity 120c (FIG. 13B) of the lower terminals 120. The first member and second members 171, 173 can comprise flat bars or may have other shapes and/or configurations. The first member 171 can comprise an electrically conductive primary substrate such as copper with an electrically insulating material such as an epoxy or coating comprising an insulating polymeric or rubber material. The first member 171 can be a horizontal member and the second member 173 can be releasably or fixedly attached to the first member 171. The second member 173 can, in some embodiments, be to be perpendicular to the first member 171 to ground to the cradle 135. However, other attachment orientations and/or ground locations may be suitable as long as the second member 173 is able to ground the terminals (upper or lower, depending on the desired test configuration) to an appropriate ground location. In some particular embodiments, the first member 171 can have a width that is in a range of about 15-40 inches.

In some particular embodiments, the second member 173 can be an upright member and can have any suitable length. In some embodiments, the second member 173 can have a length L (FIG. 8B) that is in a range of about 10-30 inches. The second member 173 can comprise an electrically conductive primary substrate such as copper. The upper and lower end portion 173e of the second member 173 can be attached to the ground interface 137 and may have a smaller thickness than a major portion of the member 173.

The ground connection interface 137 can be provided as a shaped bar, i.e., a flat bar or flat bar segment that extends out from the base 135, typically out from a back wall of the housing 100h or a back side of the base 135 and projects a distance upward. The ground connection interface 137 can be external to the housing 100h and can extend out of an aperture 136 in a rear wall of the base 135. However, the ground connection interface 137 may have other configurations and be placed in other locations. The ground connection interface 137 can electrically ground the bus bar 173 to the chassis or housing 100h. The ground connection interface 137 may also be electrically coupled to a second spaced apart ground connection interface 237 (FIGS. 5A, 5B, 6A, 6B) that can electrically engage a switchgear ground connection such as a ground cable, for example, when in position. The ground connection interface 137 can comprise a conductive (i.e., metal) bar that extends out of the aperture 136 and can project upwardly (as shown) or any other direction so that second member 173 and/or second member 178, when in position, can be electrically grounded effectively.

FIG. 4C illustrates another configuration of the test device 100. In this configuration, the second ground assembly 175 is attached to the test device 100 and the first ground assembly 170 is removed. The primary conductor arms 150 can be attached to the lower terminals 120. The primary discs 180 can also be attached to the primary conductor arms 150.

Figure 13C:
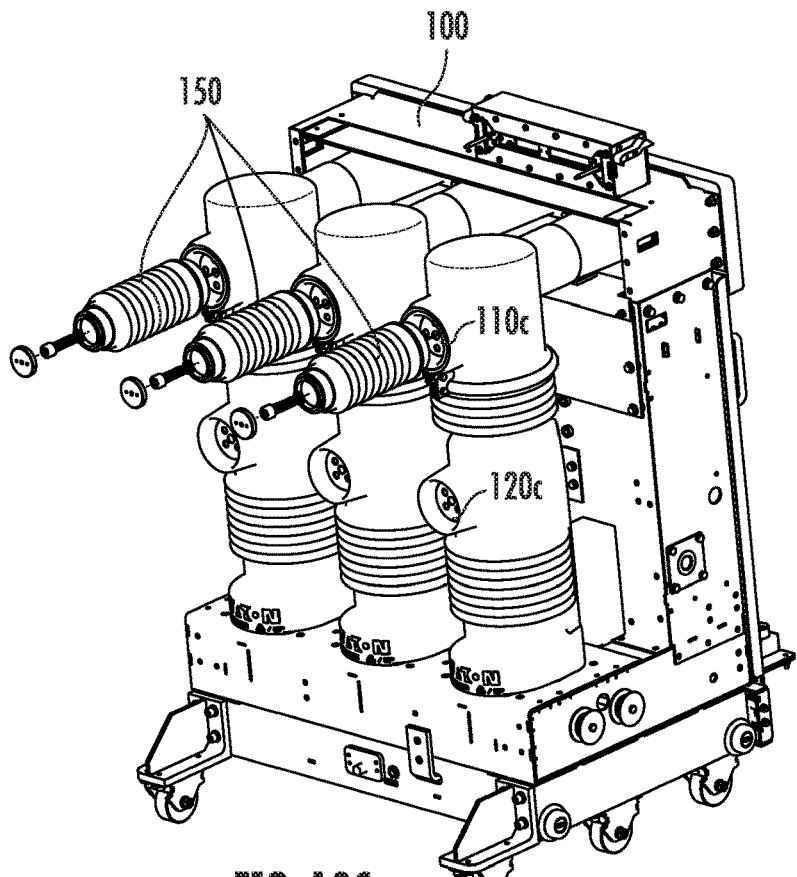
Figure 13D:
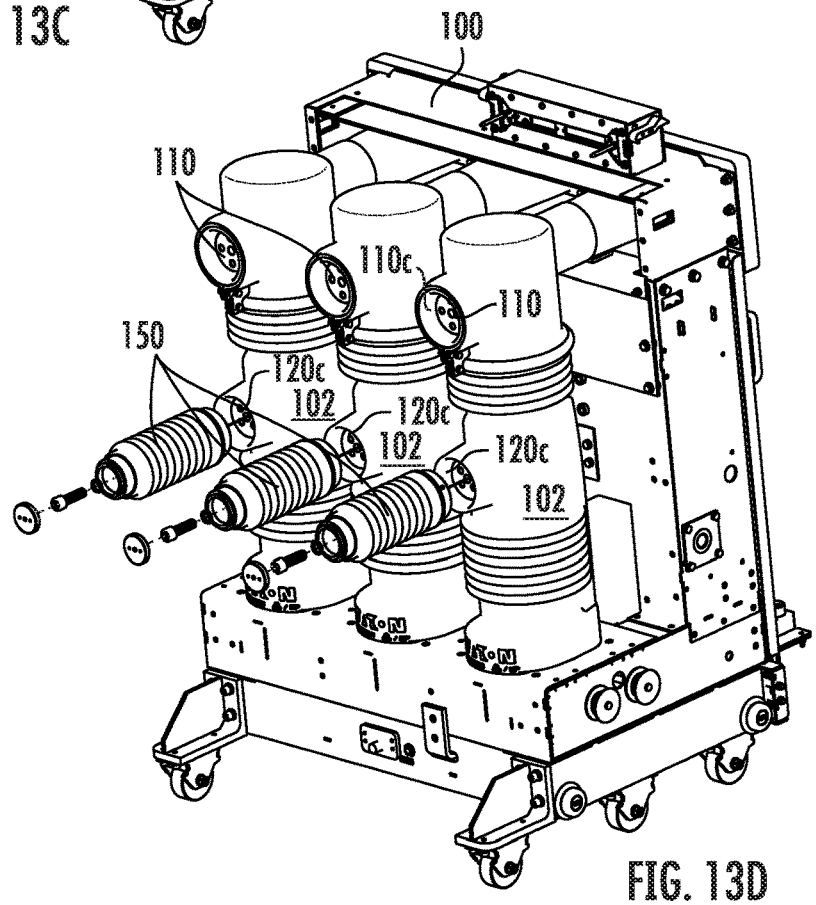

The second ground assembly 175 can have a first member 176 that can have a width sufficient to extend across all of the upper terminals 110 and can hold a plurality of laterally spaced apart electrically non-conductive plugs and/or spacers 172 that can couple to a cavity 110c (FIG. 13C) of the upper terminals 110. The first member 176 can be the same member as the first member 171 of the first ground assembly 170 or can be provided as a separate component. That is, the first member 171 of the first ground assembly along with the caps or insulating spacers 172 can be interchangeably serially releasably attached to either of the second members 173, 178 to couple to either the upper or lower terminals, depending on the desired test configuration.

The primary conductor arms 150 can be the same as the primary conductor arms 150 used for the upper terminals 110 (FIG. 5A). The first member 176 is attached to a second member 178. The lower end portion 178e of the second member 178 can releasably attach to the ground connection interface 137.

The first member 176 and the second member 178 can comprise a flat bar or bars or may have other shapes and/or configurations. The first member 176 can comprise an electrically insulating material such as an epoxy or coating comprising an insulating polymeric or rubber material. The first member 176 can be a horizontal member and the second member 178 can be releasably or fixedly attached to the first member 176. In some embodiments, the second member 178 is an upright member. In some embodiments, the second member 178 can be releasably attached to the first member 176. In some particular embodiments, the first member 176 can have a width that extends across all of the poles 102 and can have any suitable width. In some embodiments, the width can be in a range of 15-40 inches. In some particular embodiments, the second member 178 can have a length L (FIG. 7B) that is greater than the length L of the second member 173. In some particular embodiments, the length L can optionally be in a range of about 12-42 inches. The second member 178 can, in some embodiments, be releasably or fixedly attached to be perpendicular to the first member 176 to ground to the cradle 135. However, other attachment orientations and/or ground locations may be suitable as long as the second member 178 is able to ground the terminals (upper or lower, depending on the desired test configuration) to an appropriate ground location.

Referring to FIG. 4D, the test device 100 can have a voltage sensing configuration where the test device 100 is inserted into a test position of a switchgear, the switch (i.e., VI breaker) 130 is closed which grounds the switch 130. The probes 200 can be inserted when the test device is in a closed state and at the test position. The switch 130 is then opened and inserted into the switchgear connect position. The switch 130 can be closed and the line voltage can be sensed via voltage sensing probes 200. The first and second ground assemblies 170, 175 are not attached in this configuration (i.e., for the upper device configuration, the switch 130 is open while for the lower device configuration, the switch 130 is closed). The upper terminals are capped with insulating caps or spacers 190. The primary conductor arms 150 are attached to the lower terminals 120. FIG. 4E illustrates the cap 190 attached to the lower terminal 120 with a gasket 192.

Figure 4F:
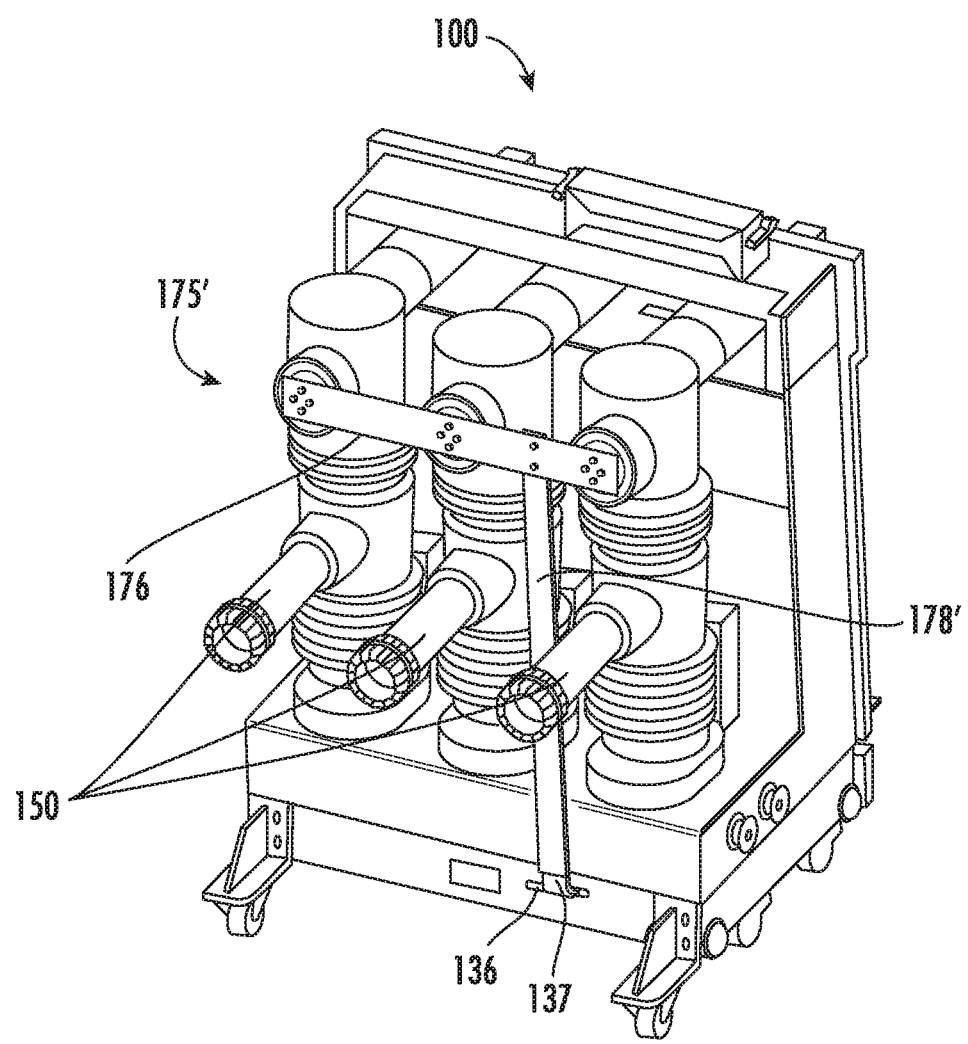
FIG. 4F is a rear side perspective view of the test device shown in FIG. 4A with an alternate ground assembly configuration from FIG. 4C according to embodiments of the present invention.

FIG. 4F illustrates a different configuration of the second ground assembly 175' with a different shaped upright member 178' from the upright member 178 shown in FIG. 4C, for example.

FIGS. 5A and 5B illustrate the upper version of the test device 100 with the primary conductor arms 150 attached to the upper terminals 110 and the first ground assembly 170 attached to the lower terminals 120 and the ground interface connection 137.

Figure 6A:
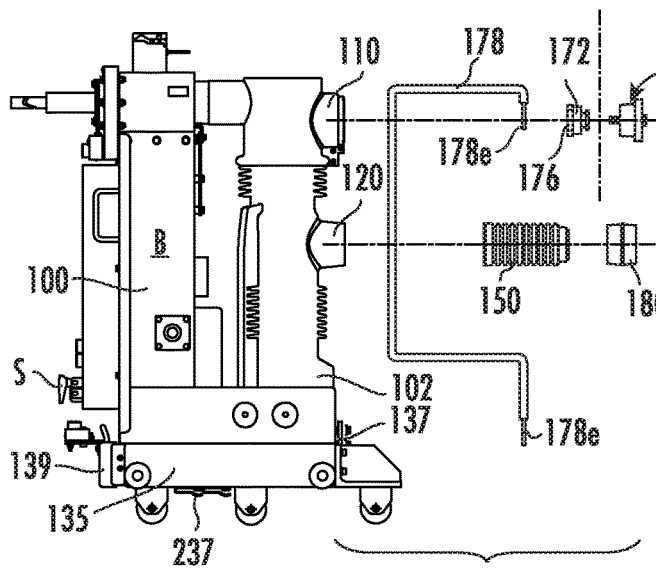
FIG. 6A is a side partial exploded view of a test device with a releasably attachable first ground assembly and primary conductor components according to embodiments of the present invention.
Figure 6B:
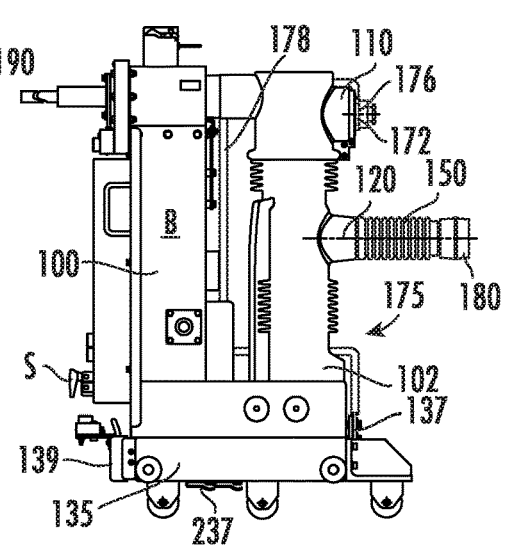
FIG. 6B is an assembly view of the device and components shown in FIG. 6A.
Figure 6C:
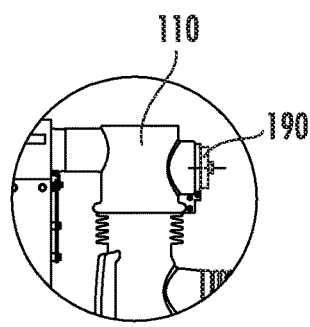
FIG. 6C is a partial section assembled view of the insulating plug and upper terminal connection for a sensing configuration according to embodiments of the present invention.

FIGS. 6A and 6B illustrate the lower version of the test device 100 with the primary conductor arms 150 attached to the lower terminals 120 and the second ground assembly 175 attached to the upper terminals 110 and the ground interface 137. FIG. 6B illustrates a grounding mode and FIG. 6C illustrates a sensing mode with the second ground assembly 175 removed and replaced with caps 190.

FIG. 7A illustrates that the second ground assembly 175 can be provided as separate components with the upright second member 178 separate from the first member 176 for field assembly. Typically the first member 176 is pre-assembled to hold the spaced apart caps 172 (i.e., insulating spacers). FIG. 7B illustrates that they may be preassembled in a "plug and play" (i.e., ready to use or ready to install) configuration or in an easy to (re) assemble configuration and may be provided as a pre-assembled set of components ready for installation.

Referring to FIG. 7A, the second upright member 178 of the ground assembly 175 can have a "C" like shape with a medial vertical segment Vs residing between upper and lower horizontal segments Hs that extend more rearward and position the upper and lower end portions 178e a distance in front of the vertical segment Vs. This configuration can position the vertical segment Vs a distance away from the load or lower terminals 120 and provide improved dielectric spacing/safety. The horizontal segments Hs can have a length that is between about 7-20 inches and the vertical segment Vs can have a height that is between about 12-24 inches, in particular embodiments.

FIG. 8A illustrates that the first ground assembly 170 can be provided as separate components with the second member 173 separate from the first member 171 for field assembly. Typically the first member 171 is pre-assembled to hold the spaced apart caps 172 (i.e., insulating spacers). FIG. 8B illustrates that the ground assembly 170 may be pre-assembled in a "plug and play" (i.e., ready to use or ready to install) configuration or in an easy to (re) assemble configuration and may be provided as a pre-assembled set of components ready for installation.

FIG. 9A illustrates that the primary conductor arms 150 and the primary discs 180 can be provided as separate components for field assembly. FIG. 9B illustrates that the primary conductor arms 150 can be preassembled to respective primary discs 180 and provided as sets of pre-assembled components ready for field installation. The primary conductor arms 150 with the primary discs 180 may be preassembled in a "plug and play" (i.e., ready to use or ready to install) configuration or in an easy to (re) assemble configuration and may be provided as a pre-assembled set of components ready for installation.

Figure 10A:
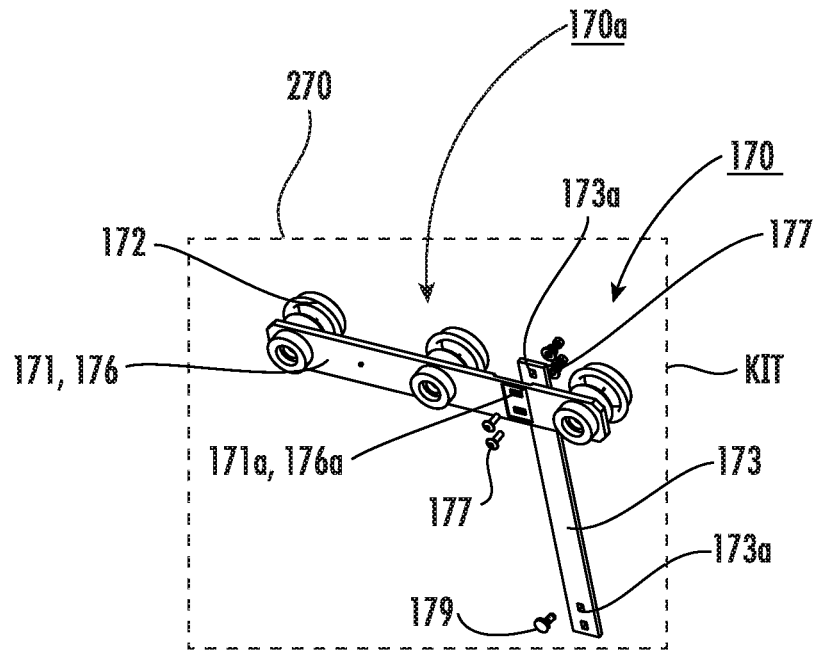
FIG. 10A is an assembled view of a first ground assembly that may be provided in an assembled configuration or as separate components in a kit for field installation according to embodiments of the present invention.

FIG. 10A illustrates that the first ground assembly 170 can be provided as a kit 270 of components, optionally with the first member 171 preassembled to the caps 172 as a sub-assembly 175a as shown. The second member 173 can be provided as releasably attachable member as shown. The kit 270 can be provided in a separate package for storage and field site selective use with the test device 100. The kit 270 can include fixation members 177, i.e., screws or other fixation hardware that can extend through at least one aperture 171a residing between a neighboring pair of insulating caps 172. The kit 270 can also include fixation members 177 and/or 179 that extend through at least one aperture 173a at the upper and lower end portions of the second member 173. The at least one aperture 173a at the upper end portion aligns with the at least one aperture in the first member 171 for coupling.

Figure 10B:
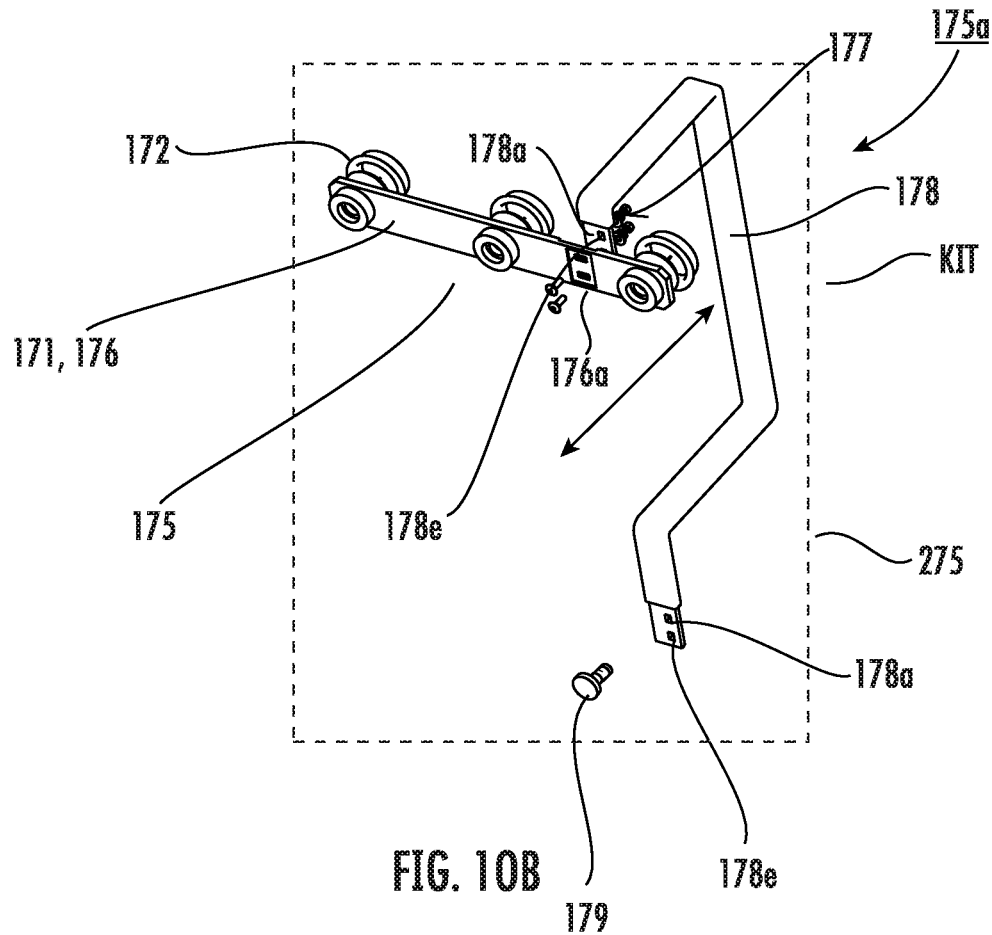
FIG. 10B is an assembled view of a second ground assembly that may be provided in an assembled configuration or as separate components in a kit for field installation according to embodiments of the present invention.

FIG. 10B illustrates that the second ground assembly 175 can be provided as a kit 275 of components, optionally with the first member 176 preassembled to the caps 172 as a sub-assembly 175a as shown. The second member 178 can be provided as a releasably and serially attachable member to the first member 171 or 176 which can be the only ground bar used for each ground assembly 170, 175, as shown. The kit 275 can be provided in a separate package for storage and field site selective use. The kit 275 can include fixation members 177 and/or 179, i.e., screws or other fixation hardware that can extend through at least one aperture 176a residing between a neighboring pair of insulating caps 172 and/or residing at upper and lower end portions of the member 178e.

The sub-assembly 175a, 170a can be interchangeably and serially attached to the different ones or the second members 173, 178 to form the respective first and second ground assemblies 170, 175. The at least one aperture 178a at the upper end portion aligns with the at least one aperture 171a, 176a in the first member 171, 176 (which can be the same member) for serially and detachably coupling the first member to the upright members 173, 178.

Figure 11A:
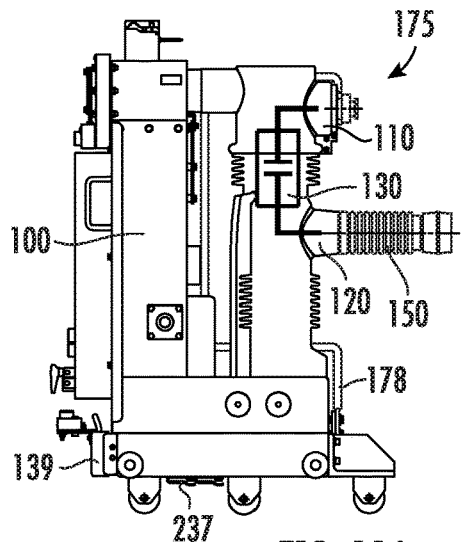
FIGS. 11A-11F are side schematic views of different configurations of the lower terminal configuration of the test device using a ground assembly for grounding and sensing lower terminals of a switchgear according to embodiments of the present invention.
Figure 11B:
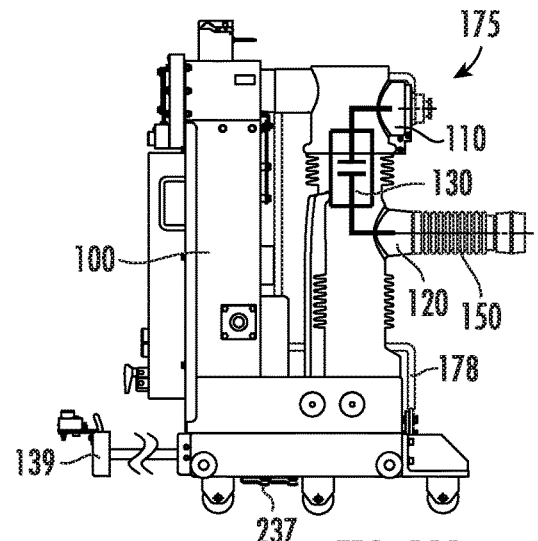
Figure 11C:
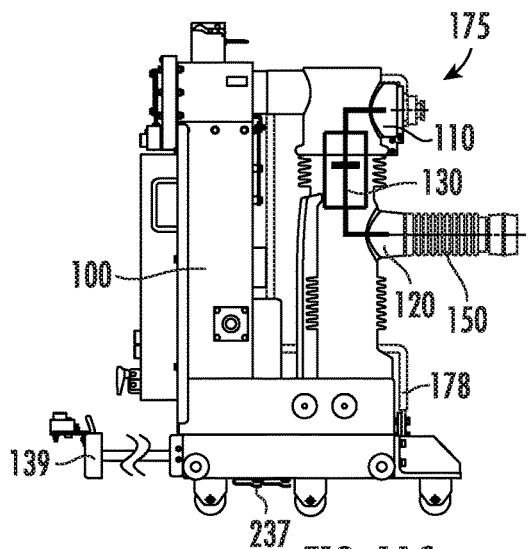
Figure 11D:
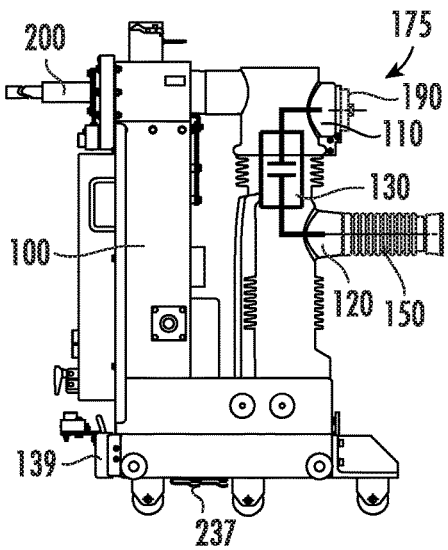
Figure 11E:
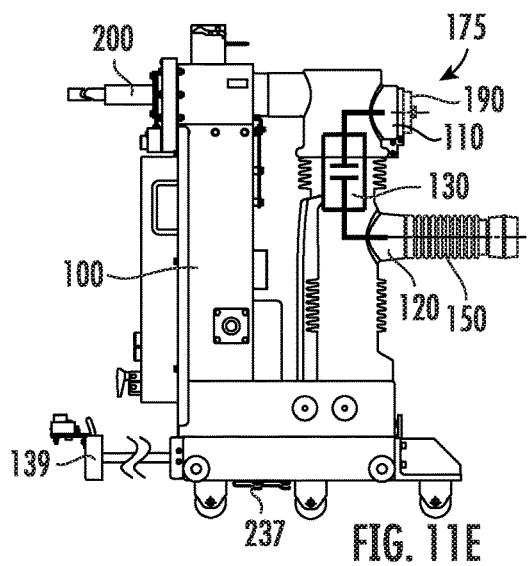
Figure 11F:
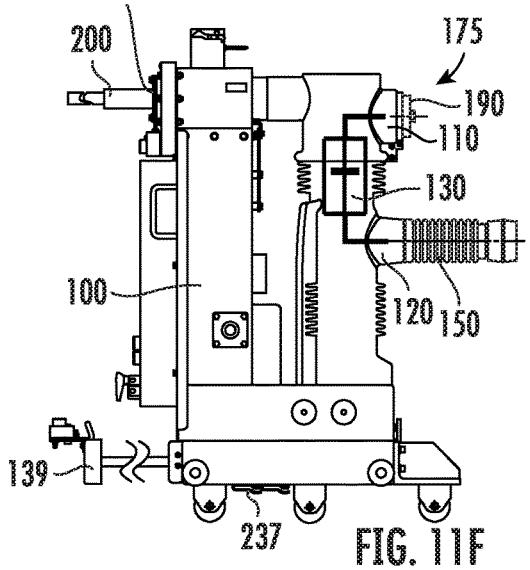

FIGS. 11A-11F illustrate various configurations of the test device 100 with only the lower terminals 120 comprising the primary conductor arms 150 and with the upper terminals 110 comprising either the ground assembly 175 or the caps 190. When the caps 190 are in place, the voltage sensing probe(s) 200 can be used (FIGS. 11D-11F). Where there are three phases, there are three probes. FIG. 11A illustrates the breaker/switch 130 open and the test device at a TEST position. FIG. 11B illustrates the breaker/switch open at a connect position. FIG. 11C illustrates the breaker/switch closed at the connect position with the lower terminal grounded. FIG. 11D illustrates the breaker/switch opened 130, the test device 100 racked out of the cell of the switchgear or other target electrical distribution apparatus and the second ground assembly 175 replaced with the insulating plugs 190 and with the probes 200 in probe sockets 119. FIG. 11E illustrates the breaker/switch 130 open, the test device racked into the cell at the connect position. FIG. 11F illustrates the breaker/switch 130 closed and the test device 100 at the connect position with the test probes 200 sensing lower terminal voltages. See, e.g., U.S. Pat. No. 9,607,784 for examples of test, disconnect and connect positions in a cell of a switchgear, the contents of which are hereby incorporated by reference as if recited in full herein.

Figure 12A:
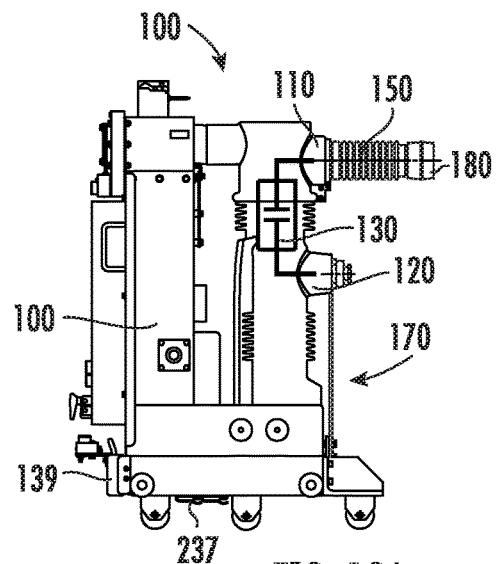
FIGS. 12A-12E are side schematic views of different configurations of the upper terminal configuration of the test device using a ground assembly for grounding and sensing upper terminals of a switchgear according to embodiments of the present invention.
Figure 12B:
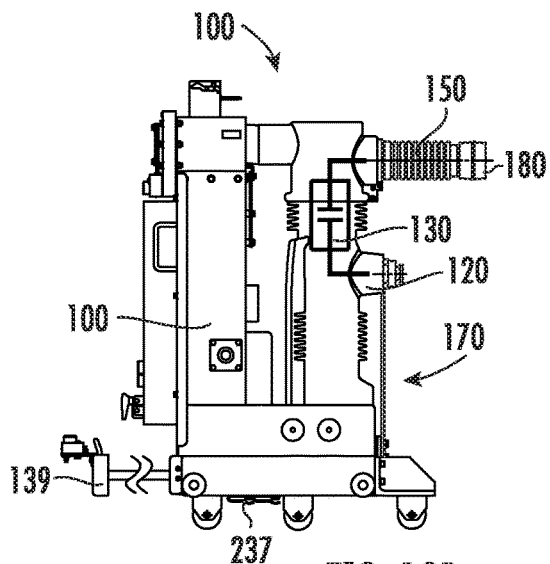
Figure 12C:
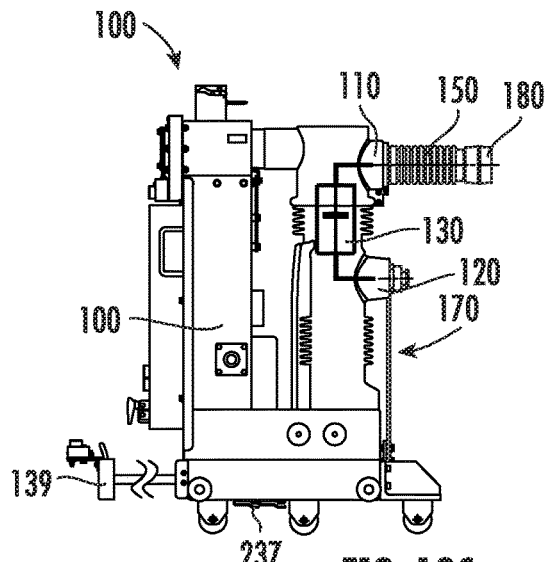
Figure 12D:
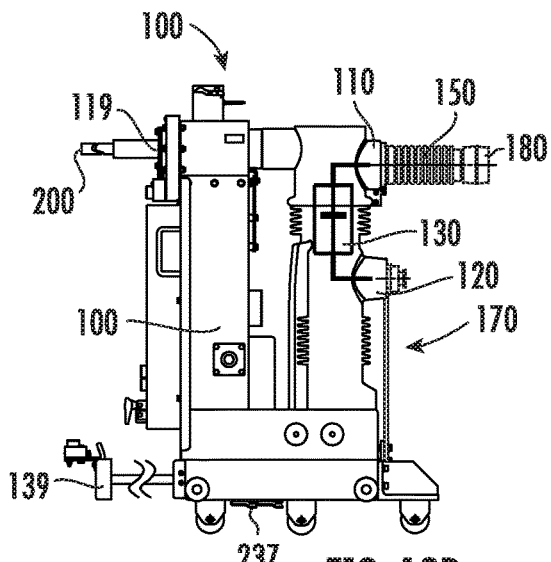
Figure 12E:
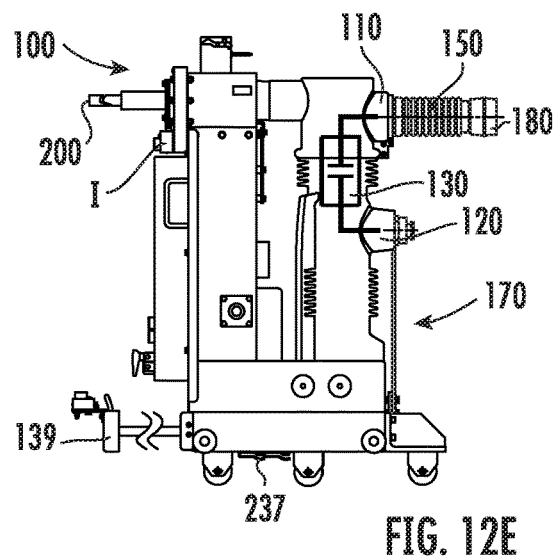

FIGS. 12A-12E illustrate various configurations of the test device 100 with the first ground assembly 170 attached thereto and only the upper terminals 110 comprising the primary conductor arms 150. The primary conductor arms 150 are in the upper terminals and the switch/breaker 130 can be in open and closed states for different testing conditions. FIG. 12A illustrates the switch 130 open with the test device 100 at a test position. FIG. 12B illustrates the switch 130 open with the test device 100 at a connect position. FIG. 12C illustrates the switch 130 closed and the upper terminals grounded. FIG. 12D illustrates the switch 130 closed and the test probe(s) 200 in position in open sockets 119 on the front of the test device 100. There can be three probes 200 for three phases. FIG. 12E illustrates the switch 130 open and the test probes 200 sensing upper terminal voltages.

The above procedures illustrated in FIGS. 11A-11F and FIGS. 12A-12E are provided by way of example only and not limiting to the present invention. Thus, the voltage probing may be performed either at G&TD switch contacts of switch 130 closed (as an illustrated example of lower terminal device—FIGS. 11A-11F) or at G&TD switch contacts of the switch 130 open (as an illustrated example of upper terminal device—FIGS. 12A-12E). In contrast to conventional practice in the industry, where the probes 200 are used to probe the voltage when the breaker/switch 130 is open (as discussed with FIG. 12E), the methodology disclosed with respect to FIG. 11F is novel. Thus, embodiments of the present invention can also connect the socket connections of the switch 130 to the lower terminals 120 and get exactly opposite operating methods discussed above with FIG. 12E, i.e., lower terminals—voltage probing at breaker/switch open (FIG. 12E); and upper terminals—voltage probing at breaker closed (FIG. 11F).

FIG. 13A illustrates a first configuration of the test device 100 with the first ground assembly 170 attached thereto and the primary conductor arms 150 attached to the upper terminals 110. This may be a standard configuration provided by the OEM at purchase. FIGS. 13B-13E illustrate the conversion procedure for field changeover to the second test configuration shown in FIG. 13F where the second ground assembly 175 is in position on the test device and the primary conductor arms 150 attached to the lower terminals 120. However, the configuration shown in FIG. 13F may be the standard configuration provided at purchase (from the OEM) and the reverse steps can be used to modify to the configuration of FIG. 13A. Alternatively, the test device 100 can be provide with no pre-assembled conductor arms 150 and no pre-assembled ground assembly 170, 175, with the associated components provided in sets of components in one or more kits for field installation.

Figure 13E:
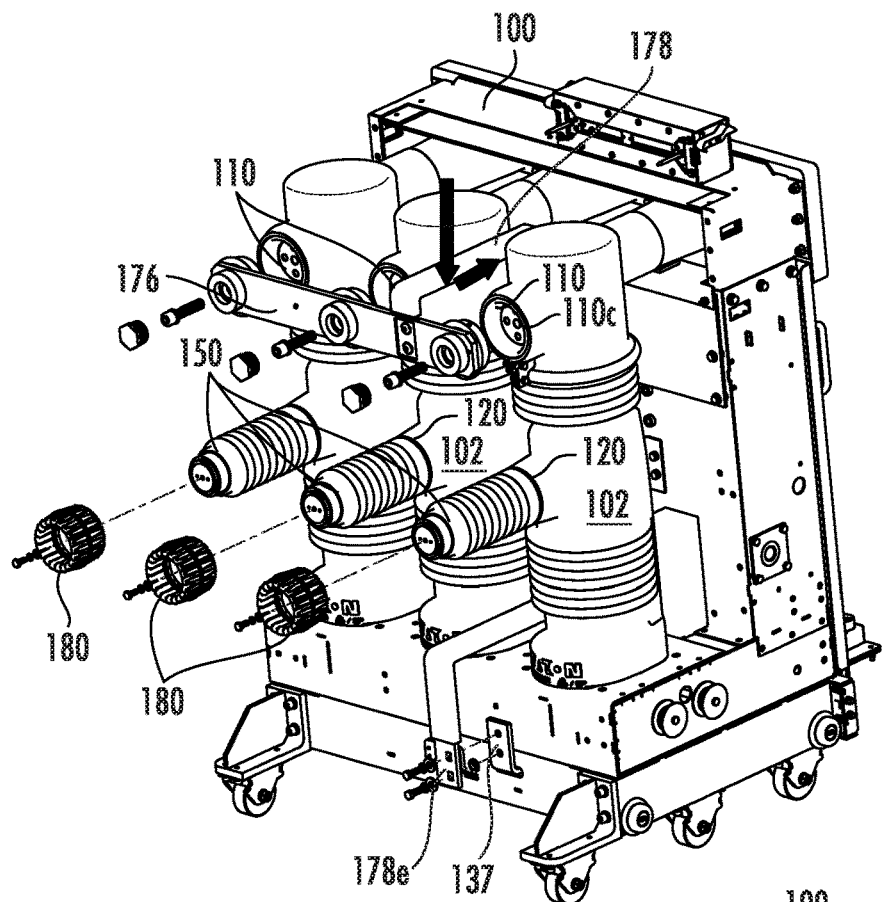
Figure 13F:
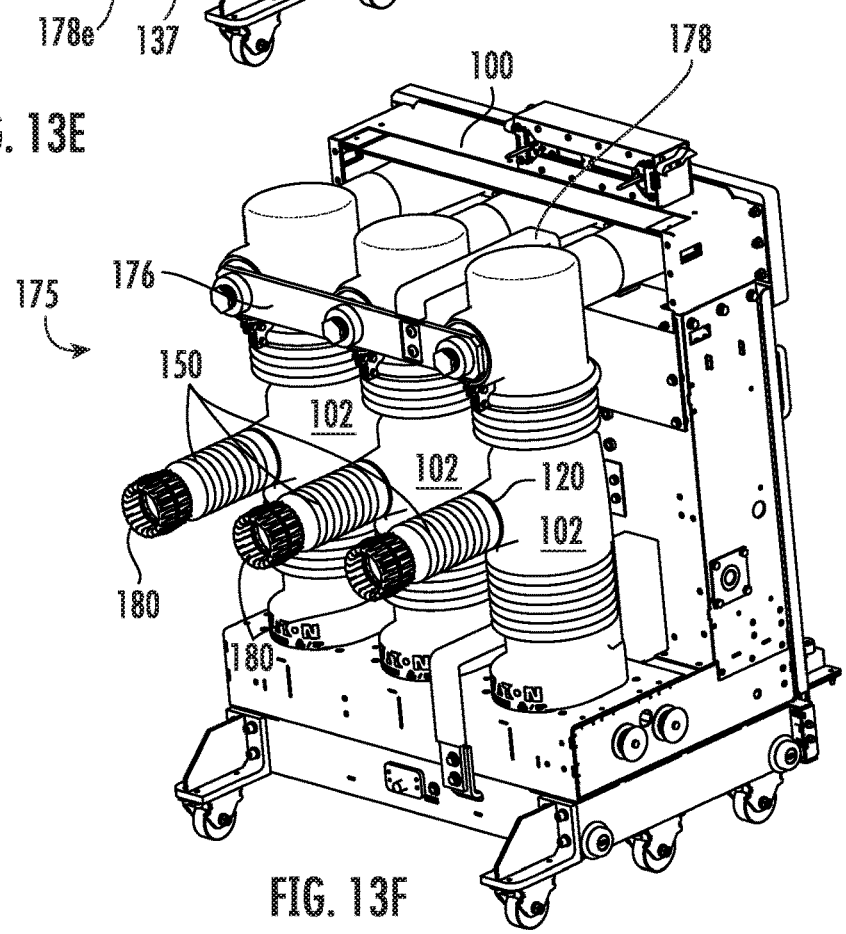

As shown by the downward and inward arrows in FIG. 13E, in some embodiments, the ground assembly 175 can be assembled then the upright member 178 can be slid downward and inward from a top side of the test device to be placed in position between adjacent ones of two poles 102 with the bottom end portion 178e aligned over the ground connection interface 137, below the lower terminals 120.

Figure 14:
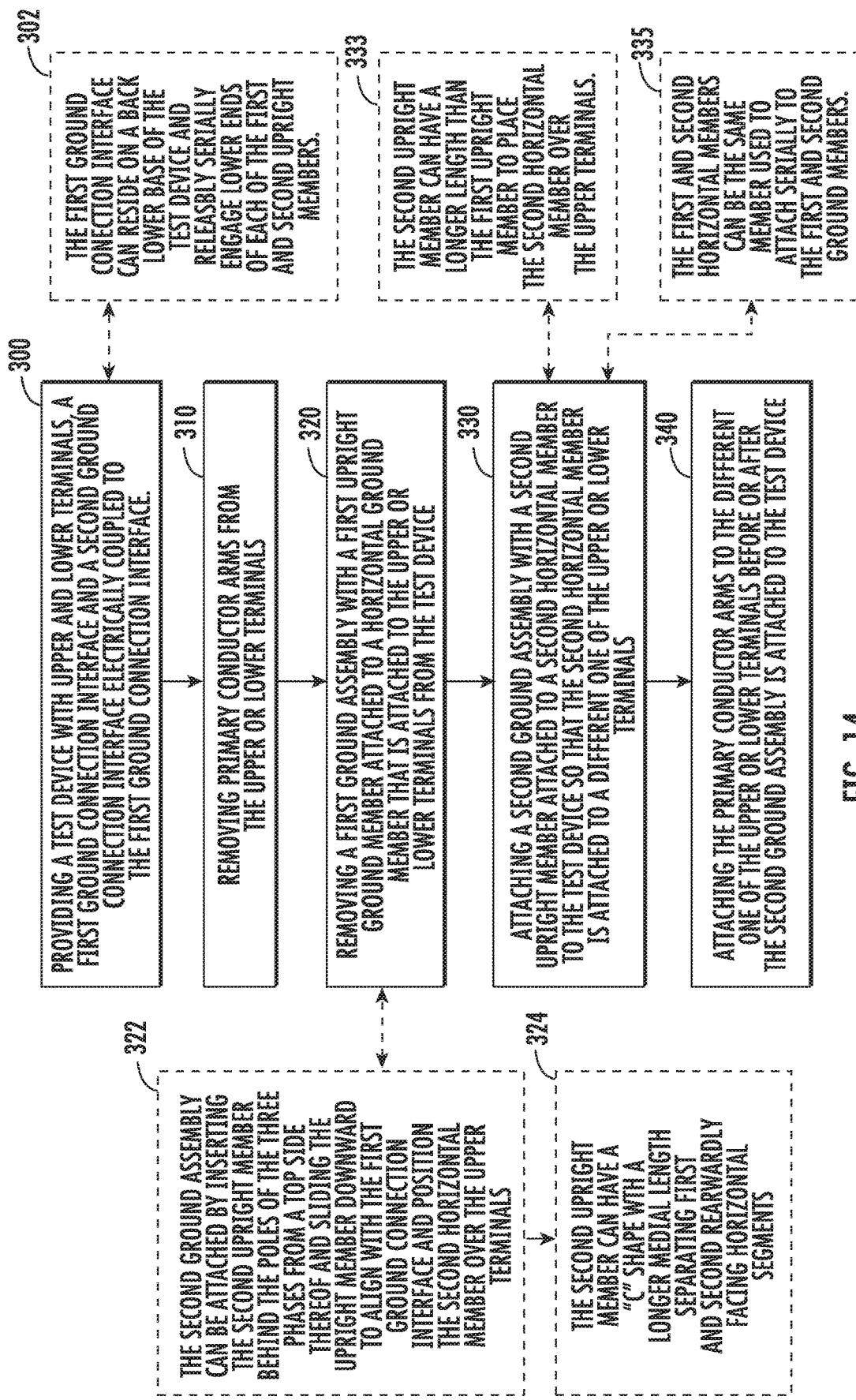
FIG. 14 is a flow chart of a method of physically modifying a test device to be able to sense either a load side or a line side of an electrical distribution device (such as a switchgear) according to embodiments of the present invention.

FIG. 14 is an example of operations that can be carried out to configure a GT&D according to embodiments of the present invention. As shown, a test device with upper and lower terminals, a first ground connection interface and a second ground connection interface electrically coupled to the first ground connection interface is provided (block 300). Primary conductor arms can be removed from the upper or lower terminals (block 310). A first ground assembly with a first upright ground member attached to a horizontal ground member that is attached to the upper or lower terminals can be removed from the test device (block 320). A second ground assembly with a second upright member attached to a second horizontal member can be attached to the test device so that the second horizontal member is attached to a different one of the upper or lower terminals (block 330). The same or different primary conductor arms can be attached to the different one of the upper or lower terminals before or after the second ground assembly is attached to the test device (block 340).

The first ground connection interface can reside on a back side of a lower base of the test device and releasably serially engage lower ends of each of the first and second upright members (block 302).

The second ground assembly can be attached by inserting the second upright member behind the poles of the three phases from a top side thereof and sliding the upright member downward to align with the first ground connection interface and position the second horizontal member over the upper terminals (block 322).

The second upright member can have a "C" shape with a longer medial length separating first and second rearward facing horizontal segments (block 324).

The second upright member can have a longer length than the first upright member to place the second horizontal member over the upper terminals (block 333).

The first and second horizontal members can be the same member used to attach serially to the first and second ground members (block 335).

Figure 15A:
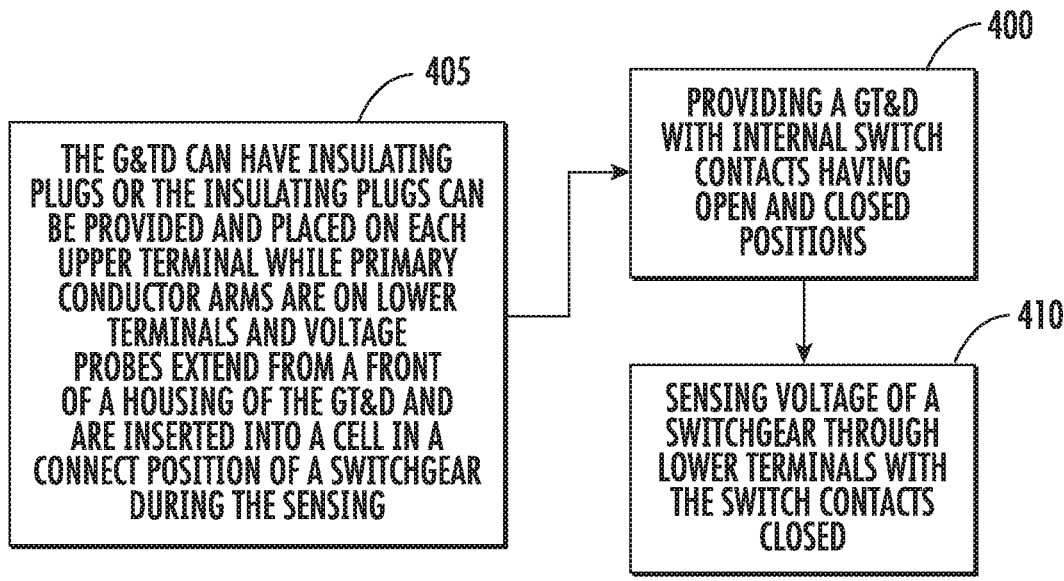
FIGS. 15A and 15B are flow charts of example methods of operating a G&TD according to embodiments of the present invention.

FIG. 15A illustrates a method of operating a ground and test device (G&TD). A GT&D with internal switch contacts having open and closed positions is provided (Block 400). Voltage of a switchgear can be sensed through lower terminals with the switch contacts closed (block 405).

The G&TD can have insulating plug or the insulating plugs can be provided and placed on each upper terminal while primary conductor arms are on lower terminals and voltage probes extend from a front of a housing of the GT&D and are inserted into a cell in a connect position of a switchgear during the sensing (block 410).

Figure 15B:
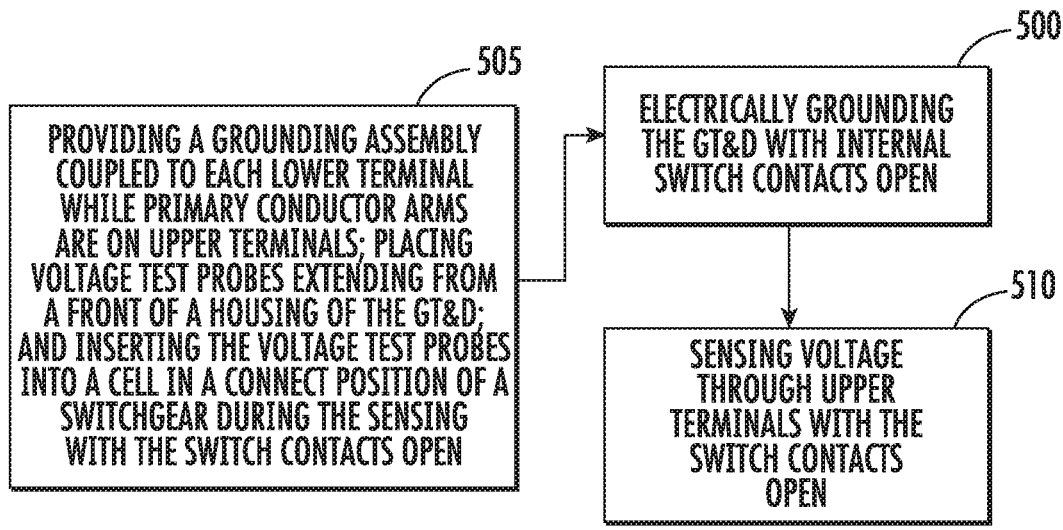

FIG. 15B illustrates another exemplary operating method. The method can include electrically grounding the GT&D with internal switch contacts open (block 500) and sensing voltage through upper terminals with the switch contacts open (block 510).

Before the sensing, a grounding assembly can be provided and/or coupled to each lower terminal while primary conductor arms are on upper terminals; voltage probes can be placed to extend from a front of a housing of the GT&D and the voltage probes can be inserted into a cell in a connect position of a switchgear during the sensing with the switch contacts are open (block 505).

The methods of operating the ground and test devices can be carried out based on user selection whereby the grounding can be performed by either closing or opening the switch contacts of the device.

The voltage probing can be performed either at G&TD switch contacts closed or at G&TD switch contacts open.

The voltage probing devices can be inserted into and/or removed from G&TD probing sockets when the G&TD is closed and at Test position of the switchgear or cell, as a safety feature.

The voltage probing devices can be inserted into and/or removed from in the G&TD probing sockets when the G&TD is open and at TEST position of the switchgear or cell, as a safety feature.

The following steps and orders may be used for some conversions of the test device between different test assembly configurations and testing operations. However, this order is by way of example only and not limiting to the present invention.

Step 1: Remove the upper ground bar assembly, pole units (lower terminals) and cradle or any grounding connection:
   A. Remove hardware connecting ground bar and cradle.
   B. Remove nylon plugs & hardware connecting ground bar assembly to the pole units.

C. Remove grounding assembly—upper version.
D. Remove primary disc.
Step 2: Remove the primary conductor arm assembly from upper terminals.
A. Remove the arm nut.
B. Dis-assemble conductor arm assembly.
Step 3: Convert the upper ground bar assembly to a lower ground bar assembly.
Step 4: Assemble primary arm assembly back on the lower terminals.
A. Assemble conductor arm assembly
B. Insert and tighten the arm nut.
Step 5: Install the lower ground bar assembly from the pole units (upper terminals) to the grounding assembly (cradle assembly).
A. Assemble conductor arm assembly
B. Insert and tighten the arm nut.
C. Install the primary finger cluster or primary disc.
====
Step 6a: Further to step 5, insert the breaker in the cell at connect position.
Step 6b: Close the SEG&TD in order to ground the outgoing feeders.
Step 6c: After grounding, open the SEG&TD (usually after 20 sec delay).
Step 6d: Rack out the SEG&TD toward test and then out of the cell.
Step 6e: Remove and conserve lower terminal grounding assy.
====
Step 7a: Insert the insulating spacers on the upper terminals of the pole units along with the conductor gasket.
Step 7b: Insert the SEG&TD at test position, close it and insert the test probes into the sockets.
Step 7c: Open the SEG&TD and rack toward connect position inside the cell.
Step 7d: Close the SEG&TD and sense the feeder voltage via test probes.

The foregoing is illustrative of the present invention and is not to be construed as limiting thereof. Although a few exemplary embodiments of this invention have been described, those skilled in the art will readily appreciate that many modifications are possible in the exemplary embodiments without materially departing from the novel teachings and advantages of this invention. Accordingly, all such modifications are intended to be included within the scope of this invention. Therefore, it is to be understood that the foregoing is illustrative of the present invention and is not to be construed as limited to the specific embodiments disclosed, and that modifications to the disclosed embodiments, as well as other embodiments, are intended to be included within the scope of the invention.

That which is claimed is:

1. A ground and test device (G&TD), comprising:
a test device housing comprising a switch;
a plurality of upper terminals coupled to the switch;
a plurality of lower terminals coupled to the switch;
a ground connection interface coupled to the test device housing;
a first ground assembly releasably attached to or attachable to the test device housing, the first ground assembly comprising a plurality of insulating caps, one each coupled to a corresponding one terminal of the upper or lower terminals and electrically coupled to the ground connection interface; and
a plurality of primary conductor arms releasably attached to only the upper terminals or only the lower terminals when the first ground assembly is in position on the test device housing.

2. The G&TD of claim 1, wherein the first ground assembly comprises a first member that holds the insulating caps and a second member that is attached to the first member, and wherein the second member has an end portion that is attached to the ground connection interface.

3. The G&TD of claim 1, wherein the test device housing comprises a base with a back wall comprising an aperture, and wherein the ground connection interface comprises a metal bar that extends out of the aperture.

4. The G&TD of claim 2, further comprising a second ground assembly releasably attachable to the test device housing, and wherein the second ground assembly comprises a second member that has a length that is greater than the second member of the first ground assembly.

5. The G&TD of claim 4, wherein the second member of the second ground assembly serially releasably attaches to the first member of the first ground assembly in place of the second member of the first ground assembly.

6. The G&TD of claim 4, wherein the second member of the second ground assembly has a medial vertical segment that merges into upper and lower horizontal segments that place outer end portions of the horizontal segments further away from a front of the test device housing than the vertical segment.

7. The G&TD of claim 1, wherein the first ground assembly comprises a first member that is held horizontally oriented on the test device housing, wherein the first member is releasably attachable to a second member at a location between neighboring insulating caps, and wherein the second member comprises an end portion that is releasably attached to the ground connection interface.

8. The G&TD of claim 1, wherein the first ground assembly comprises a first ground bar that holds the plurality of spaced apart insulating caps, and a first bus member that is releasably attachable to the ground bar, wherein the G&TD further comprises a second bus member that is releasably interchangeably attachable to the first ground bar in lieu of the first bus member, wherein the first and second bus members have different vertical lengths, wherein each of the first and second bus members have opposing upper and lower end portions with at least one aperture that releasably engages a fixation member, wherein the upper end portion of each of the first and second bus members releasably serially couple to the first ground bar, wherein the lower end portion of each of the first and second bus members releasably and serially couple to the ground connection interface, wherein, in position on the test device housing in a first G&TD assembled configuration, the first ground assembly places the ground bar across the lower terminals, and wherein, in position on the test device housing in a second G&TD assembled configuration, the second bus bar places the ground bar across the upper terminals.

9. The G&TD of claim 1, wherein the first ground assembly comprises a first bus bar releasably coupled to a first ground bar, wherein the first ground bar comprises at least one aperture between a neighboring pair of the insulating caps, wherein the first bus bar comprises at least one aperture at an upper end portion thereof and at least one aperture at a lower end portion thereof, and wherein the first ground assembly further comprises fixation members that are configured to couple the first bus bar to the first ground bar and couple the first bus bar to the ground connection interface.

10. The G&TD of claim 1, wherein the first ground assembly comprises a planar ground bar with a width greater than a height thereof and comprising a conductive primary substrate with an outer layer or coating of a non-conductive material that holds the insulating caps, wherein there are three of the insulating caps, wherein the planar bus bar is releasably attachable to the ground bar in an orientation that is orthogonal to the bus bar, wherein the bus bar comprises upper and lower end portions, each of the upper and lower end portions comprising at least one aperture, wherein the ground connection interface comprises at least one through aperture, wherein the first ground assembly further comprises fixation members that extend through the at least one aperture of the upper and lower end portions of the bus bar with the at least one aperture of the lower end portion configured to align with the at least one aperture of the ground connection interface to releasably attach to the ground connection interface, and wherein the upper end portion of the bus bar is configured to align the at least one aperture with the at least one aperture of the ground bar to releasably attach the ground bar to the bus bar with the fixation members extending through the aligned at least one aperture.

11. A kit of components for a ground and test device (G&TD), comprising:
   a ground bar comprising a plurality of spaced apart insulating caps sized and configured to serially and interchangeably couple to either only upper terminals of the G&TD or only lower terminals of the G&TD at any one time; and
   a bus bar that releasably attaches to or is attached to the ground bar.

12. The kit of claim 11, wherein the ground bar is configured to directly and serially couple to only the upper terminals or only the lower terminals at any one time and comprises at least one aperture between a neighboring pair of the insulating caps, the kit further comprising at least one fixation member that is configured to couple the bus bar to the ground bar and extends through the at least one aperture.

13. The kit of claim 11, wherein the bus bar is releasably attached to the ground bar, wherein the ground bar is horizontally and vertically aligned with respective upper terminals when coupled to the upper terminals, wherein the ground bar is horizontally and vertically aligned with respective lower terminals when coupled to the lower terminals, wherein the bus bar comprises upper and lower end portions, each of the upper and lower end portions comprising at least one aperture, and wherein the kit further comprises fixation members that extend through the at least one aperture of the upper and lower end portions, the lower end portion configured to releasably attach to a ground connection interface of the G&TD and the upper end portion is configured to releasably attach to the ground bar.

14. A kit of components for a ground and test device (G&TD), comprising:
   a ground bar comprising a plurality of spaced apart insulating caps sized and configured to serially and interchangeably couple to either only upper terminals of the G&TD or only lower terminals of the G&TD; and
   a bus bar that releasably attaches to or is attached to the ground bar,
   wherein the plurality of spaced apart insulating caps is three, wherein the bus bar is a first bus bar, the kit further comprising a second bus bar having a length that is greater or smaller than the first bus bar, and wherein the first and second bus bars serially and interchangeably releasably attach to the ground bar.

15. The kit of claim 11, further comprising three primary conductor bars, wherein the three primary conductor bars releasably attach to either only the upper terminals or only the lower terminals at any one time, and wherein: (a) the ground bar directly attaches to only the upper terminals while the three primary conductors are attached to the lower terminals or (b) the ground bar directly attaches to only the lower terminals while the three primary conductors are attached to the upper terminals.

16. A method for modifying a ground and test device (G&TD), for testing a switchgear, comprising:
   providing a test device with upper and lower terminals and a first ground connection interface, wherein the test device is configured to releasably engage primary conductor arms and first and second ground assemblies;
   configuring the test device to include only the first ground assembly coupled to the ground connection interface with the primary conductor arms on only the upper or only the lower terminals for a first test configuration; then
   configuring the test device to include only the second ground assembly coupled to the ground connection interface with the primary conductor arms on only the other of the upper terminals or the lower terminals for a second test configuration.

17. The method of claim 16, wherein the configuring steps include removing three primary conductor arms from either the upper or lower terminals and placing the same three primary conductor arms on the other of the upper or lower terminals.

18. The method of claim 16, wherein the first and second ground assemblies include first and second bus members of different shapes and/or different vertical lengths, wherein the configuring steps comprise removing the first bus member attached to a horizontally oriented ground member and attaching the second bus member to the horizontally oriented ground member, then attaching the horizontally oriented ground member comprising insulating caps to either the lower terminals or the upper terminals and attaching the second bus member to the ground connection interface of the test device.

19. The method of claim 16, wherein the first ground connection interface resides on a back side of a base of the test device and is configured to releasably and serially engage lower ends of first and second bus members of the first and second ground assemblies.

20. The method of claim 16, wherein the second ground assembly is attached by inserting a second bus member behind poles providing three phases of the test device from a top side thereof and sliding the second bus member downward to align with the first ground connection interface and position a horizontal ground member over the upper terminals.

21. The method of claim 20, wherein the second bus member has a "C" shape with a medial vertical length separating first and second rearwardly projecting horizontal segments.

22. A method of operating a ground and test device (G&TD):
   providing a G&TD with internal switches having switch contacts associated with poles of the G&TD and a plurality of upper and lower terminals, with primary conductors attached to only the upper terminals or only the lower terminals at any one operational test configuration; and selectively grounding the G&TD in a first test configuration by closing the switch contacts or grounding the G&TD in a second test configuration by opening the switch contacts.

23. The method of claim 22, further comprising voltage sensing using either the first test configuration or the second test configuration.

24. A method of operating a ground and test device (G&TD):
provide a G&TD with internal switches having switch contacts associated with poles of the G&TD and a plurality of upper and lower terminals, with primary conductors attached to only the upper terminals or only the lower terminals at any one operational test configuration;

selectively grounding the G&TD in a first test configuration by closing the switch contacts or grounding the G&TD in a second test configuration by opening the switch contacts; and inserting voltage probes into or removing voltage probes from G&TD probing sockets when the G&TD is in the first test configuration and at a TEST position of a switchgear or cell thereby providing a safety feature.

25. A method of operating a ground and test device (G&TD):
providing a G&TD with internal switches having switch contacts associated with poles of the G&TD and a plurality of upper and lower terminals, with primary conductors attached to only the upper terminals or only the lower terminals at any one operational test configuration;

selectively grounding the G&TD in a first test configuration by closing the switch contacts or grounding the G&TD in a second test configuration by opening the switch contacts; and further comprising inserting voltage probes into or removing voltage probes from G&TD probing sockets when the G&TD is the second test configuration and at a TEST position of a switchgear or cell thereby providing a safety feature.

* * * * *